(12) United States Patent
Raatz et al.

(10) Patent No.: US 12,552,622 B2
(45) Date of Patent: Feb. 17, 2026

(54) CONTACTLESS CONVEYING DEVICE

(71) Applicant: Robert Bosch GmbH, Stuttgart (DE)

(72) Inventors: Heike Raatz, Stuttgart (DE); Philipp Guth, Stuttgart (DE); Joachim Frangen, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 195 days.

(21) Appl. No.: 18/552,076

(22) PCT Filed: Mar. 14, 2022

(86) PCT No.: PCT/EP2022/056464
§ 371 (c)(1),
(2) Date: Sep. 22, 2023

(87) PCT Pub. No.: WO2022/200094
PCT Pub. Date: Sep. 29, 2022

(65) Prior Publication Data
US 2024/0174459 A1    May 30, 2024

(30) Foreign Application Priority Data

Mar. 25, 2021 (DE) .................. 10 2021 202 915.9

(51) Int. Cl.
*B65G 54/02* (2006.01)
*B65G 47/90* (2006.01)
(Continued)

(52) U.S. Cl.
CPC .......... *B65G 54/02* (2013.01); *B65G 47/902* (2013.01); *H01L 21/67709* (2013.01); *H01L 21/67742* (2013.01); *H01L 21/68707* (2013.01)

(58) Field of Classification Search
CPC ............ B65G 47/90–904; B65G 52/04; H01L 21/67709; H01L 21/67742; H01L 21/68707
See application file for complete search history.

(56) References Cited

U.S. PATENT DOCUMENTS 8,851,817 B2 * 10/2014 Bonora ............. H01L 21/67766
414/217
10,926,418 B2 * 2/2021 Lu ............................ H02K 7/06
(Continued)

FOREIGN PATENT DOCUMENTS

DE    10 2016 224 951 A1    6/2018

OTHER PUBLICATIONS

International Search Report corresponding to PCT Application No. PCT/EP2022/056464, mailed Jun. 14, 2022 (German and English language document) (6 pages).

*Primary Examiner* — Gene O Crawford
*Assistant Examiner* — Keith R Campbell
(74) *Attorney, Agent, or Firm* — Maginot, Moore & Beck LLP

(57) ABSTRACT

A conveying device is configured to convey one or more payloads, in particular wafers, using transport bodies. The transport bodies are floatingly moved and positioned over a transport surface of a stator. The moving and positioning are preferably carried out with respect to all six degrees of freedom. The transport body has a movable boom or a movable manipulator or a movable robotic arm. At an end effector thereof, the payload is deposited or fastened. The payload can also be processed and/or checked. The processing and/or checking is carried out by an end effector of an additional transport body of the same conveying device.

20 Claims, 18 Drawing Sheets

(51) Int. Cl.
    *H01L 21/677* (2006.01)
    *H01L 21/687* (2006.01)

(56) References Cited

U.S. PATENT DOCUMENTS

| | | | |
|---|---|---|---|
| 11,764,092 B2* | 9/2023 | Hatano | B25J 11/0095 |
| | | | 414/222.13 |
| 11,912,508 B2* | 2/2024 | Huber | B65G 54/02 |
| 11,948,822 B2* | 4/2024 | Li | H01L 21/68707 |
| 11,990,357 B2* | 5/2024 | Hatano | H01L 21/6838 |
| 2012/0213614 A1 | 8/2012 | Bonora et al. | |
| 2015/0214086 A1 | 7/2015 | Hofmeister et al. | |
| 2020/0111692 A1 | 4/2020 | Newman et al. | |
| 2020/0262660 A1 | 8/2020 | Hosek et al. | |

* cited by examiner

231/241

231/241

Step 1

Step 2

Step 3

Step 4

Step 1

Step 2

Fig. 12c Step 3
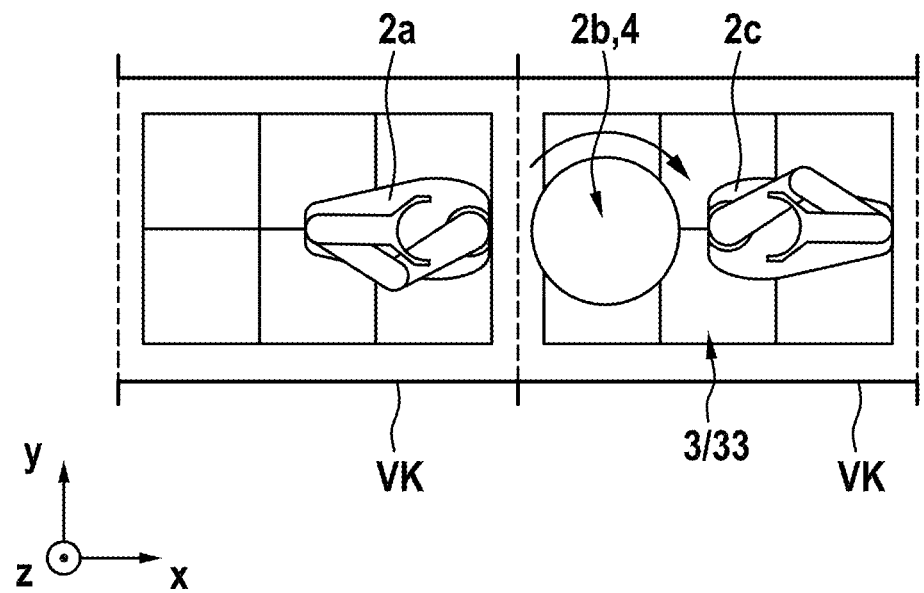
Fig. 12d Step 4
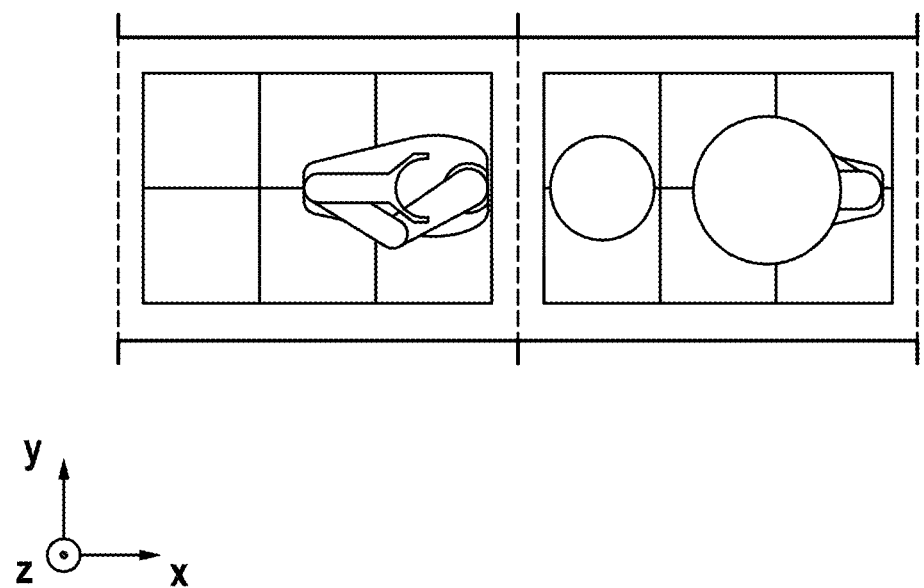

CONTACTLESS CONVEYING DEVICE

This application is a 35 U.S.C. § 371 National Stage Application of PCT/EP2022/056464, filed on Mar. 14, 2022, which claims the benefit of priority to Serial No. DE 10 2021 202 915.9, filed on Mar. 25, 2021 in Germany, the disclosures of which are incorporated herein by reference in their entirety.

The disclosure relates to a contactless conveying device. In particular, the conveying device according to the present disclosure is suitable for industrial applications in the assembly technology, biological, chemical, pharmaceutical, and food industries as well as in solar cell/display manufacturing, medical technology, laboratory automation, and logistics. Particularly preferred is the application of the conveying device in the semiconductor industry.

BACKGROUND

In the context of technical manufacturing, payloads such as materials, parts, tools or products often need to be transported or positioned. For this purpose, both contacting and contactless conveying devices are known, which find application for example in machine and plant engineering, e.g. for transporting payloads in packaging machines, for positioning machine elements or for positioning tools as precisely as possible on the part, e.g. for laser processing, or in the semiconductor industry for coating, exposing or structuring substrates in wafer clusters or stepper facilities. Magnetic levitation systems can be used in this context.

One challenge in magnetic levitation is to provide a stable structure floating in a magnetic field. A further challenge is to automatically position and/or move the floating structure according to a target specification in all six degrees of freedom (three translational and three rotational), which is also referred to as full magnetic levitation.

According to DE 10 2016 224 951 A1, such a controlled conveying and positioning of a transport body carrying a payload relative to a stator is made possible in that one of the two elements has a plurality of at least partially movably arranged control magnets whose respective position and/or orientation relative to this element can be predefined in a controlled manner via actuating elements, and the other of the two elements has at least two stationary magnets immovably connected to that element, the stationary magnets being magnetically coupled to the control magnets. The conveying device is configured to convey the transport body relative to the stator by controlled positioning and/or orientation of control magnets. The transport body is in this case also brought to and held in a desired position and/or orientation relative to the stator.

DE 10 2016 224 951 A1 offers the advantage that a levitation and/or forward movement of the transport body relative to the stator is enabled by a corresponding positioning and/or orientation of the control magnets by means of the respective control elements. In this way, provision of a complex arrangement and driving of solenoids can be omitted. This not only reduces the complexity of the conveying device and thus the manufacturing costs, but also enables the use of permanent magnets, which can often provide a much greater flux density than solenoids usable for such purposes. This in turn can enable a greater vertical height, i.e., a greater gap between the stator and the transport body, which can result in a greater freedom of movement during movements in the Z direction and or in the pitch and roll angular range. Furthermore, this provides the advantage that even a disruption in the supply of electrical energy may not necessarily lead to a malfunction, or even cause damage. In particular, an interruption of the power supply does not lead to loss of the magnetic field or the magnetic coupling between the stator and the transport body. For example, in the event of an interruption of the power supply, the coupling forces between the control magnets and the stationary magnets may increase as soon as the position and/or the orientation of the control magnets yields to the attractive force effect of the stationary magnets, whereupon the transport body is pulled onto the stator and thus secured against uncontrolled dropping. The magnetic coupling between the stator and the transport body can both levitate the transport body, i.e., lift it over the stator, and can also move the transport body relative to the stator, i.e. convey it, without even more contacting or contactless systems being absolutely necessary.

Thus, contactless transport is enabled such that the disclosed conveying device can also be used in environments with increased cleanliness requirements. For example, the transport body can be conveyed in the environment with the increased cleanliness requirement while the stator is arranged outside in an environment with lower cleanliness requirements. Separating elements can pass through a gap between the stator and the transport body in order to separate the various cleanliness areas. Thus, the disclosed conveying device is also suitable for use in biological, chemical and/or pharmaceutical methods, as well as in gas-tight, liquid-tight and/or encapsulated areas, for example.

In a typical semiconductor manufacturing line, wafers are processed in production facilities (e.g., cluster tools). Typically, wafers are transported under normal pressure in transport containers between the production facilities, the transporting being done in batches of a typical batch size of 25 pieces. Within a production facility, the wafers are typically processed and transported under Ultra High Vacuum (UHV). A production facility includes at least one process station for processing the wafers, a generic conveying device for transporting the wafers in a vacuum, and a supply area for supplying processed and un-processed wafers. The at least one process station, conveyor device, and supply area are enclosed in vacuum-tight chambers and can be evacuated down to UHV. The chambers are arranged laterally adjacent to one another and connected to one another—if necessary via vacuum-tight airlocks.

For transferring the wafers between the transport container and the production facility and for supplying several wafers in the vacuum area, a so-called vacuum load lock is located at the production facility. The transport container is inserted into the vacuum load lock under normal pressure, then the vacuum load lock is evacuated. Then, a vacuum air lock opens between the vacuum load lock and the conveyance area of the production facility, and the wafers are removed from the transport container through the air lock or placed into the transport container.

After all wafers have been removed from the transport container, processed and placed back in the transport container, the vacuum air lock is closed and the vacuum load lock is vented. Then, the transport container is removed from the vacuum load lock under normal pressure and transported to the next production facility, for example.

SUMMARY

The object of the present disclosure is to provide a conveying device that enables complex and efficient processes. The scope of functions of the transport body should be expandable to include functions for handling, positioning, fixing, for example clamping, processing and/or checking of payloads that are located on the transport body or in the vicinity of the transport body. New functions and processes with a high degree of automation, high efficiency and high profitability are to be implemented in technical manufacturing or in logistics.

This object is achieved by a conveyor as disclosed herein.

The conveying device according to the disclosure is designed for the contactless movement of at least one transport body (mover) equipped with a manipulator. The manipulator is connected to the transport body—more specifically to its housing—either as a replaceable module or as an integral part of the transport body, and is carried by the same. The transport body and a connected manipulator is positionable in its six degrees of freedom of movement with respect to a stator using the magnetic field of the stator. Moreover, the manipulator has at least one further degree of freedom of movement positionable relative to the housing of the transport body during floating operations of the transport body.

By synchronous motion control of the degrees of freedom of the housing and the manipulator, complex and efficient motion sequences are possible. The manipulator expands the scope of functions of the transport body to include functions for handling, positioning, fixing, for example clamping, processing and/or checking of payloads that are located on the transport body or in the vicinity of the transport body. The transport body with manipulator opens up numerous new fields of application of the conveying device according to the disclosure. It makes possible new functions and processes having a high degree of automation, high efficiency and high profitability in technical manufacturing or in logistics.

The manipulator, which is comprised on the transport body according to the disclosure, replaces stationary manipulators that would have to be provided at the loading and destination points if the transport body did not have its own handling function. The higher the number of positions to be moved to, the greater the savings in stationary components and thus the reduction in complexity and cost of the overall system.

In a typical application, the manipulator has an end effector that loads a payload onto the transport body at the location of loading and drops it off at the destination. The manipulator can also have a clamping function with which the payload is securely held on the transport body during transport. Furthermore, the manipulator can be provided to reorient the payload during transportation so as to transfer the payload to the destination in the proper orientation without requiring additional time.

In a further application, the manipulator is a kinematic means which guides the end effector, e.g., a process tool or a checking means. The transport body equipped in this way can machine carried payloads or payloads in its vicinity using the tool, or can check them using the checking means. Said body in this case has a high degree of flexibility in movement for this purpose. Another temporal or economic advantage arises from the parallelization of processes while simultaneously carrying out the transport and the manipulation tasks. Moreover, a manipulator can be equipped to perform multiple functions (for example, handling and checking). Furthermore, a plurality of manipulators can be present on one transport body.

Finally, there can be a plurality of transport bodies that perform a task together. For example, a part is fixed and transported on a first transport body without a manipulator. A second transport body with a manipulator accompanies the first transport body and performs handling, processing or checking tasks on the transported part by means of the manipulator.

The already addressed reorientation of the payload can also be implemented by means of a plurality of transport bodies of the conveyor device according to the disclosure.

Particular advantages arise when using the conveying device according to the disclosure in the semiconductor industry, for example when the part is a wafer. Advantageously, the transport body is used for transporting a semiconductor wafer in a vacuum transport chamber of a production facility. The stator is arranged under the vacuum transport chamber. A typical transport task in such a production facility (cluster tool) is to remove the wafer from a process nest of one process station and transport it to the process nest of another process station. Given that the process stations in a production facility are arranged laterally adjacent to the transport chamber and thus cannot be reached directly by the transport bodies, the manipulator according to the disclosure straddles the transport route from the process nest to the transport chamber. The manipulator according to the disclosure enables the wafer to be received and deposited spatially offset relative to the transport chamber and/or the conveying device, in which case the center of gravity of the wafer can lie far to the side of the transport body.

The manipulator has at least one degree of freedom, which—optionally loaded with a payload (a wafer)—guides the end effector on a motion path (e.g., from the process nest) to the transport body. The kinematic means in this case contracts and forms a compact unit together with the transport body and the payload (the wafer) which occupies about 2-4 times less transport area than a comparable transport body with a rigid end effector. For example, the manipulator is extended out for loading and unloading while it is in front of a process nest. During transport, it is in a contracted state so that the transport body is more maneuverable. The freed-up transport surface can be utilized to increase the number of transport bodies via the stator (in the transport chamber) and thus to increase the throughput and the profitability of the transport device (the production facility). The manipulator is variably positionable. From the same position of the transport body on the transport surface, it can move the payload (the wafer) to any intermediate positions between its end positions. Thus, in the case of the production facility, process nests can be loaded at different distances away from the transport surface of the stator.

In addition to the contraction movement, the manipulator can have further degrees of freedom. For example, a manipulator having two degrees of freedom can be provided, in which case a first degree of freedom performs the described contraction movement in a plane parallel to the transport surface, and a second degree of freedom performs a vertical movement perpendicular to the transport surface. Although the vertical movement can already be positioned as the degree of freedom of the transport body, the range of adjustment is necessarily narrowly limited by the levitation travel. The manipulator can be designed for a larger lifting range. A transport body equipped with this manipulator is able to load wafers onto process nests of different heights. The loading of a wafer cassette in a load lock is also possible, whereby one of a plurality of compartments of the wafer cassette vertically arranged one above the other can be loaded individually.

The following advantages are achieved over a transport body without a manipulator, or can be achieved with preferred embodiments:

a) Extended workspace: The manipulator can comprise kinematic means that extend beyond the boundaries of the transport body with regard to the degrees of freedom, and thus reach locations outside the work area of a transport body without a manipulator. For example, locations laterally adjacent to the transport surface can be reached, or locations at different heights above the transport surface.

b) Reduced complexity of the facility as a whole: The manipulator can pick up payloads at various staging locations, transport them onto the transport body and drop them off at a destination without the need for further stationary handling devices. Thus, a mobile manipulator can replace multiple stationary manipulators. This reduces the complexity and cost of the facility as a whole.

c) Reduced transport area: In order to keep the outer dimensions of the transport body and manipulator and the payload small, the manipulator can convey the payload to the center of the transport body, in particular along its housing. During transport, the transport surface occupied by the transport body is thus minimized, for example by a factor of 2-4 compared to a transport body with a rigid end effector. This has several advantageous effects which are described in d)-f).

d) Higher throughput: with the procedure described in c) more transport bodies can be accommodated on a predefined transport surface so that the throughput increases.

e) Small facility size: With a predefined number of transport bodies, the transport surface can be reduced with the procedure described in c), which leads to significant cost advantages, for example in a vacuum transport chamber which involves high operating costs in semiconductor manufacturing.

f) Better maneuverability: with the procedure described in c) the transport body can take on small external dimensions, it is then more easily maneuverable. Compensation movements are eliminated, the trajectories become shorter, maneuvers are accelerated, turning maneuvers can be carried out on the spot without obstructing other transport bodies even in a transport chamber with small dimensions.

g) Gaining time and efficiency: Handling, processing, or checking tasks on a payload can be performed while the payload is being transported. This parallelization of processes reduces the cycle time of processing.

h) Purely mechanical design: The device consisting of transport body and manipulator can be purely mechanically designed, without electrical or electronic components. The stator takes over the precise positioning and provides the mechanical energy for moving the transport body and for driving the manipulator. The energy is transferred from the stator to the transport body or to its manipulator by means of the magnetic fields. This makes the construction very space-saving, light and inexpensive. Since no energy storage system has to be carried along, no time and area needs be planned for the electrical charging of the energy storage system. Without electronics, there is no heat loss, no need for cooling. This is particularly advantageous in vacuo, where dissipation of heat from the floating device is only possible to a small extent by way of radiation. A purely mechanical design can be designed for significantly higher operating temperatures, as the usual temperature limit for protecting the electronics and the energy storage medium is eliminated. The purely mechanical device can be optimized for use under special conditions, in particular in vacuo (using vacuum-compatible materials), in explosive atmospheres (as there is no risk of electrical sparking), in a gas atmosphere or in liquids, even under the highest ambient pressures.

i) Flexibility through modularity: The mechanical interface between the transport body and the manipulator can comprise quick-release devices and couplings, so that different types of manipulators can alternately be employed on different types of transport bodies. The replacement of the manipulator can be done quickly and easily, manually or automatically, to equip the transport body for a new application.

Preferably, the transport bodies and the associated payloads are accommodated in a sealed transport chamber. The stator is arranged below the sealed transport chamber. Preferably, the respective housings of the transport bodies are also sealed. Thus, a conveying device for payloads, in particular wafers, is created that can be processed in different process stations under special environments, i.e. not in normal conditions. Transport of the payloads by means of the transport bodies of the conveying device according to the disclosure also takes place in a special environment, i.e., not in normal conditions.

Preferably, a gas (e.g., protective gas, nitrogen, or inert gas) or a gas mixture (e.g., purified air) or a vacuum or an ultra-high vacuum (e.g., up to $10^{-7}$ or up to $10^{-8}$ bar) or an aseptic area or an ABC-protected area or a liquid (e.g., up to 2 bar) is provided in the sealed transport chamber.

BRIEF DESCRIPTION OF THE DRAWINGS

Various exemplary embodiments of the conveying device according to the disclosure, including different exemplary embodiments of transport bodies, are shown in the drawings.

Shown are.

DETAILED DESCRIPTION

Figure 1A:
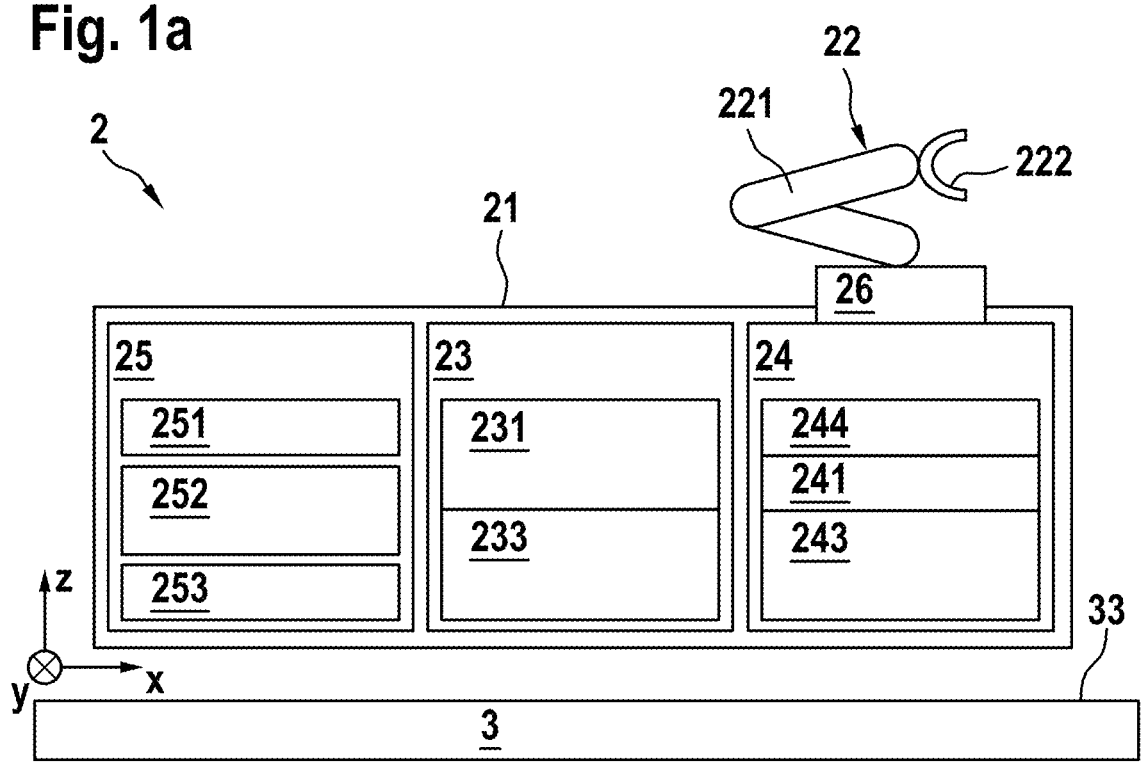
FIG. 1 three different exemplary embodiments of the conveying device according to the disclosure, FIG. 2 three different exemplary embodiments of magnet arrays of the transport body of FIG. 1, FIGS. 3a, 3b and 3d three exemplary embodiments of arrangements of magnet arrays in a housing of the transport body of FIG. 1a or 1b, FIGS. 3c and 3e two exemplary embodiments of arrangements of magnet arrays in a housing of the transport body of FIG. 1c, FIG. 4 the housing with the magnet arrays of FIG. 3a, FIG. 5 a transport body with a housing corresponding to that of FIGS. 3a and 4, with a telescopic manipulator, FIG. 6 a transport body with a housing corresponding to that of FIGS. 3a and 4, with a bendable manipulator, FIG. 7 a conveying device with the transport body with the telescopic manipulator according to FIG. 5, FIG. 8 a method for controlling the trajectory of a transport body with a manipulator, FIG. 9 a production facility for the semiconductor industry with a conveying device according to the disclosure, FIG. 10 a method for quickly changing a wafer in a process station by means of the conveying device according to the disclosure, FIG. 11 a method for transferring a wafer, without intermediate storage, from one transport body to another transport body of the conveyor according to the disclosure, and FIG. 12 a method for transferring the wafer, in which the angular position of the wafer can be altered in the full range of 360° by means of the conveying device according to the disclosure.
Figure 1B:
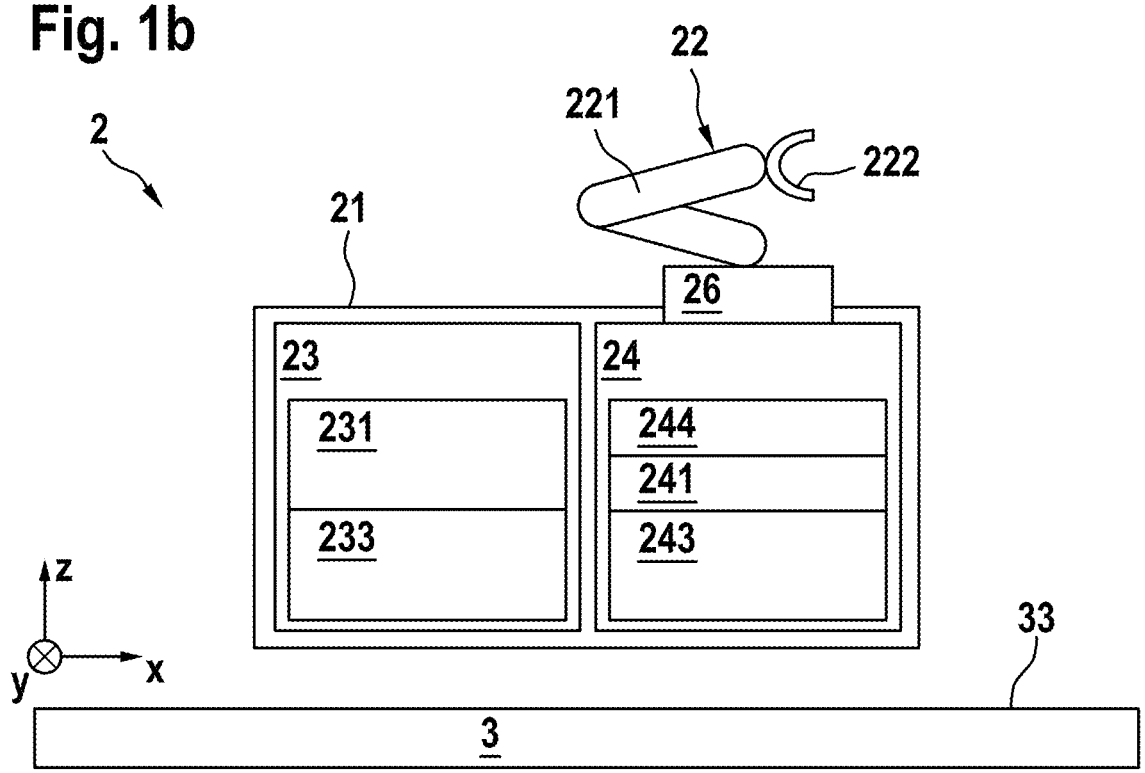
Figure 1C:
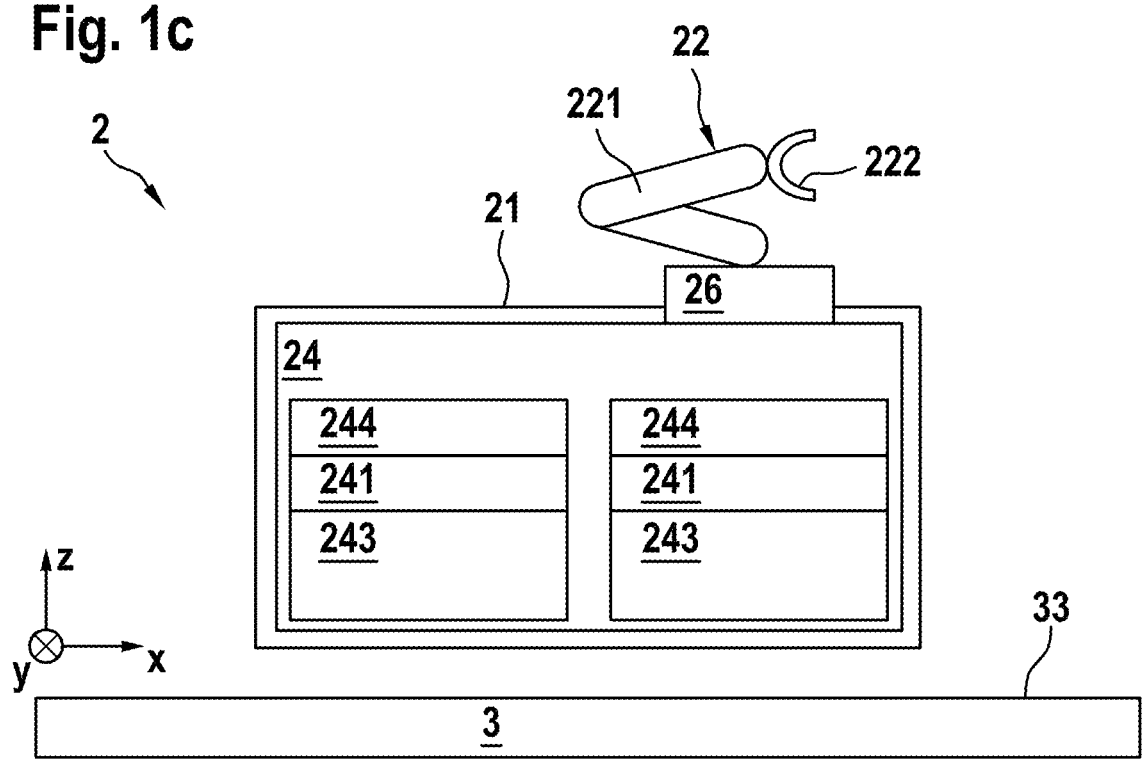

Three variants of transportation devices according to the present disclosure are shown schematically in FIGS. 1a to c. They each comprise a stator 3 and at least one transport body 2, which is conveyed in a controlled manner relative to the stator 3 without contact. For this purpose, the stator 3 has movably arranged control magnets 31 (see FIG. 7) in a flat arrangement, the orientation of the magnets being changeable using actuators. Superpositioning the magnetic fields of all the control magnets 31 results in a magnetic field (referred to herein as a levitation field). It passes up through a top plate of the stator 3. The cover plate simultaneously forms the transport surface 33 over which transport bodies 2 equipped with magnet arrays are transported in a contactless manner.

A sensor system cyclically senses the position of each transport body 2, more specifically its housing 21, in its six degrees of freedom of movement above the transport surface 33, with high frequency and accuracy. As with any rigid body, these are three degrees of freedom in translation X, Y, Z and three in rotation rX, rY, rZ of the housing 21. A controller calculates the positional deviation from a predefined target position or trajectory, and controls the magnetic angles so that the control deviation is minimal. In this way, the housing 21 of the transport body 2 is guided stably and robustly along the target trajectory against external forces.

Figure 2A:
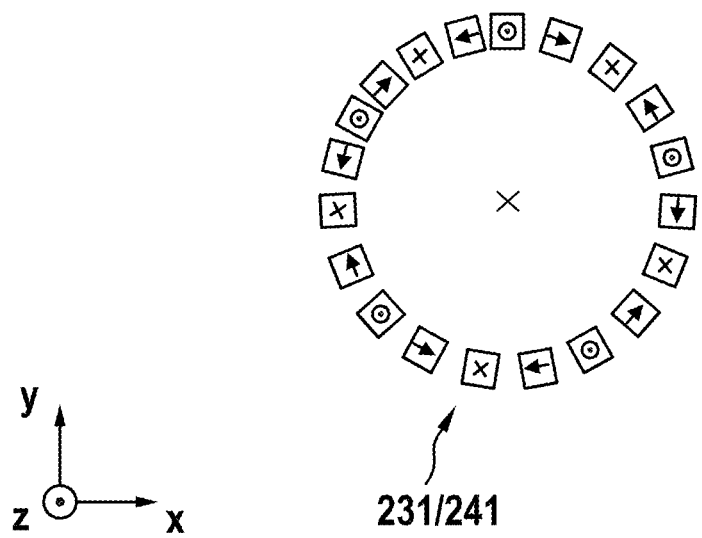
Figure 2B:
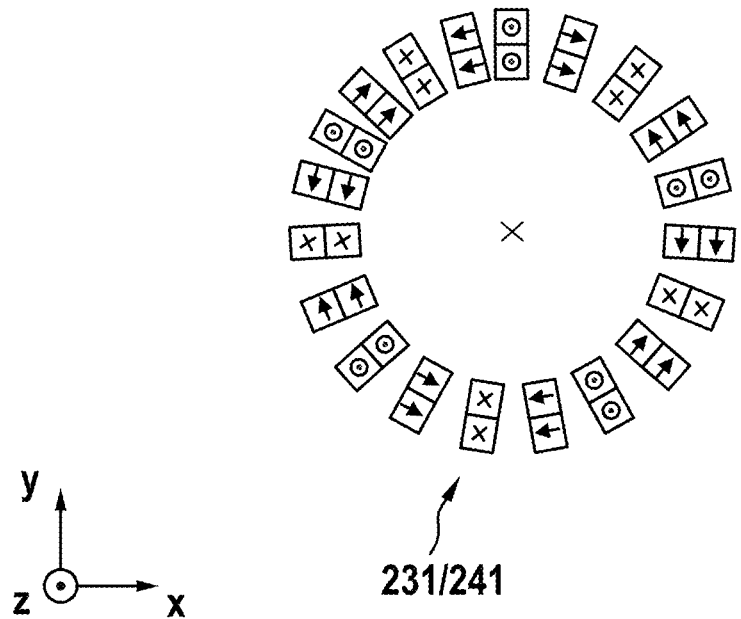
Figure 2C:
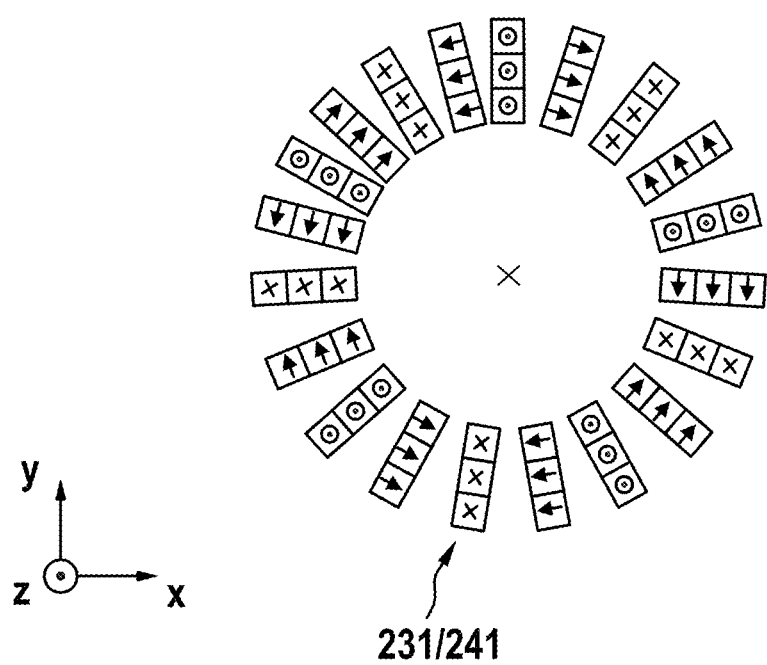

In the exemplary embodiments according to FIGS. 1a and 1b, the transport body 2 has a drive unit 23 for the housing 21, the drive unit comprising at least one magnet array 231 fixed to the housing (see FIG. 2). During operation, the magnet array 231 in the levitation field experiences forces and moments that are transferred to the rigidly-coupled housing 21 and force the housing to move. In this way, the magnet array 231 acts as a drive unit 23 for the housing 21.

In order for the drive to proceed in a controlled manner, the drive unit 23 comprises a means for detecting the position of the housing 21. Position detection is done relative to the stator 3 by attaching a position sensor to one of the two components, and attaching a code assembly 233 to the other component, the code assembly being detected by the position sensor. For example, a camera-based method for position detection can be employed by a camera module 32 attached to the housing 21, the camera module detecting a code assembly 233 on the stator 3. According to FIGS. 1a and 1b, a camera module 32 integrated in the stator 3 (see FIG. 7) detects a code assembly 233 on the housing 21.

According to the disclosure, the transport body 2 carries a movable and controllable manipulator 22 for a payload (not shown in FIG. 1), in which case the manipulator 22 is attached to the housing 21. The manipulator 22 comprises a kinematic means 221 having an end effector 222 designed as a shelf, a gripper, a clamping device, a tool, or a checking means, depending on the task.

Preferably, the end effector 222 is mounted on the kinematic means 221 as a quickly-changeable component and/or the kinematic means 221 is mounted on the housing 21 as a quickly-changeable component so that the transport body 2 can be quickly set up for a new task by manually or automatically changing the manipulator 22 or the end effector 222. The kinematic means comprises structural components and joints that provide the end effector 222 with at least one degree of freedom of movement with respect to the housing 21. For example, a joint is a pivot bearing, a linear guide, a solid-body joint guide, or a combination thereof.

To control or regulate movement of the kinematic means 221 in its at least one degree of freedom, the manipulator 22 is connected to a drive unit 24 via a coupling 26 which transmits the energy of motion to the kinematic means 221 and enables controlled positioning. In order to control a kinematic means 221 having multiple degrees of freedom, a multiple-degree-of-freedom drive unit 24 can be present or multiple drive units can operate all of the degrees of freedom of the kinematic means 221 at once.

FIG. 1b shows a purely mechanically-constructed transport body 2 with a mechanical drive unit 24 for the manipulator 22. It comprises a magnet array 241, which is connected to the housing 21 of the transport body 2 via a bearing 244. The bearing 244 enables the magnet array 241 to move in at least one degree of freedom relative to the housing 21. The magnet arrays 231 and 241 are arranged at a lateral distance on the bottom of the transport body 2, so that both lie in the area of action of the levitation field and so that the forces and moments acting between them are small in relation to the forces and moments that they experience in the levitation field.

The levitation field of the stator 3 imparts a vectorial force and vectorial moment to the movable magnet array 241. The force vector and the moment vector are split into two vectorial portions along the guide direction of the bearing 244, one portion acting in the guide direction of the bearing 244 and the other acting orthogonally to the guide direction. The portion in the guide direction is transmitted from the movable magnet array 241 to the kinematic means 221 via an output 245, e.g., a shaft or a pushrod, and a coupling 26, and can move the kinematic means. A transmission gear can also be provided to match the rotation rate of the output to the rotation rate of the kinematic means 221. The portion transverse to the guide direction is transferred from the magnet array 241 via the bearing 244 to the housing 21 and affects its movement, together with other magnet arrays.

A code assembly 243 on the movable magnet array 241 facilitates the detection of its position with respect to the housing 21. In this way, the position of the magnet array 241 can be controlled. With a mathematical model of the manipulator 22, the position of the magnet array 241 can be transformed to the position of the end effector 222 and vice versa if the magnet array 241 is rigidly coupled to the end effector 222 via the coupling 26 and the kinematic means 221. By applying the transformation, the position of the end effector 222 can also be predefined as the target parameter for the control system.

If used in special environments such as
   cleaning the transport body 2 (separation of wet exterior/dry interior),
   use under vacuum (separation of exterior vacuum/gas-filled interior),
   food or pharmaceutical area (separation of aseptic exterior/non-aseptic interior),
   explosion-proof areas,
then a sealed housing 21 for the transport body 2 is advantageous. Then, between the output of the transport body 2 and the manipulator 22, the coupling 26 can also be embodied as a magnetic coupling with contactless torque transmission. In one application, for example, the housing 21 of the transport body 2 is tightly sealed under vacuum in order to separate the atmosphere in the transport body 2 from the surrounding vacuum. Since a mechanical rotary feedthrough in the housing wall would destroy the seal, a magnetic coupling can be advantageously employed.

In another configuration, the drive unit 24 can form an assembly with the manipulator 22. For example, the magnet array 241 and the code assembly 243 can be integrated into a joint of the kinematic means 221 with the bearing 244 and the coupling 26 being omitted. If the magnet array 241 is within the range of action of the levitation field, it can be exposed to forces and moments via the stator 3, which are then transmitted directly to the kinematic means 221. When replacing the manipulator 22, the drive unit 24 is necessarily also replaced.

The manipulator 22 in FIG. 1a can be optionally electrically driven by an electric motor or mechanically driven by the drive unit 24. In the first case (electric drive), the electric motor is supplied with electrical energy and data for the target position via an electronic unit 25. In the latter case (mechanical drive), an electronic unit 25 can also be provided in the housing 21 to supply power to position sensors accommodated in the housing 21, for example.

The electronic unit 25 comprises the following electrical or electronic components, which are optionally present in the transport body 2: an energy storage device 251, for example a battery or a capacitor for supplying the electrical energy, as well as end users, for example
- a wireless communication interface 252 for communicating with a base unit in the stator 3,
- a sensor system for detecting the degrees of freedom of the transport body 2 and of the manipulator 22,
- an electric drive unit 24 for the manipulator 22,
- a user interface 253 that provides the user with power and data supply for additional application-specific units on the transport body 2.

In a preferred variant according to FIG. 1b, the transport body 2 with the manipulator 22 is constructed purely mechanically or passively. The electronic unit 25 is omitted. This has the following advantages:
- reduction of the size, weight and complexity of the transport body 2,
- savings in time and space required to charge an energy storage device 251,
- enabling and simplifying deployment under extreme ambient conditions (e.g., high temperature, vacuum, high pressure, moisture).

FIG. 1c shows a variant of a purely mechanical construction of a transport body 2 in which a combined drive unit 24 is used for the housing 21 and the manipulator 22. Unlike the exemplary embodiments of FIGS. 1a and 1b, none of the magnet arrays 241 are fixedly connected to the housing 21, each having its own bearing 244 and degrees of freedom of movement.

The bearings 244 are designed and arranged with respect to the housing 21 such that controlled movement of the housing 21 in all six degrees of freedom is possible at all times. If a magnet array 241 cannot drive a degree of freedom of the housing 21, at least one further magnet array 241 is present, which operates this degree of freedom. Suitable designs of the housing 21 and the bearing 244 exclude singular positions of the magnet arrays 241 where the housing 21 is only controllable in five or fewer degrees of freedom.

FIG. 2 shows exemplary annular magnet arrays having permanent magnets that can be employed as magnet arrays 231 that are fixed to the housing and as magnet arrays 241 that are movable relative to housing 21.

FIG. 3 shows examples of five different arrangements of magnet arrays 231, 241 with and without bearings 244 in a housing 21 of a transport body 2.

Figure 3A:
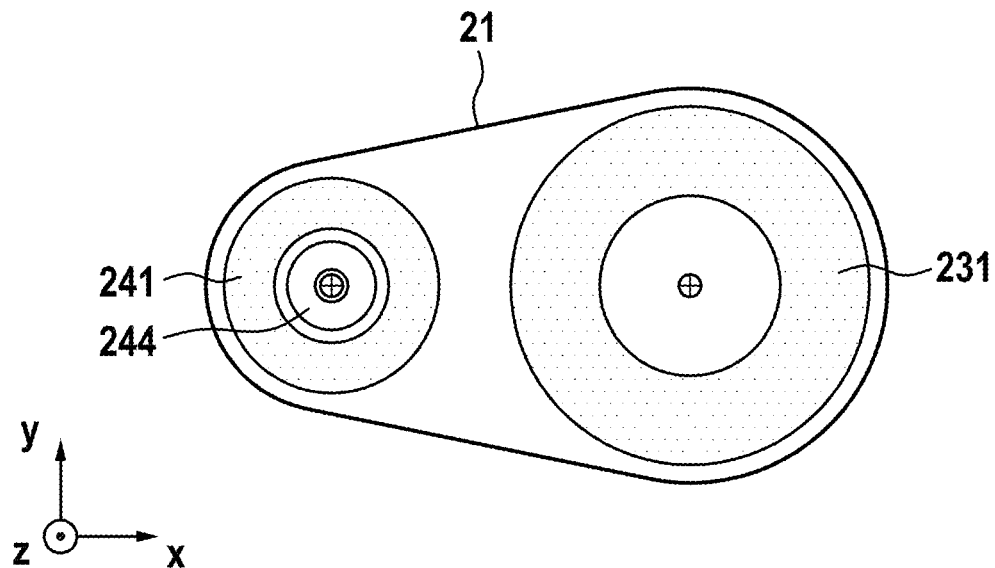

FIG. 3a: The housing 21 supports a rigidly coupled magnet array 231 and a magnet array 241 rotatably mounted in rZ. The degree of freedom rZ can be used as a drive for a manipulator 22, while the remaining five degrees of freedom X, Y, Z, rX, rY of the magnet array 241 are rigidly coupled to the magnet array 231 via the bearing and the housing 21. They are therefore available in addition to the drive of the housing 21 and extend the range of forces and moments that can be exerted on the housing 21.

Figure 3B:
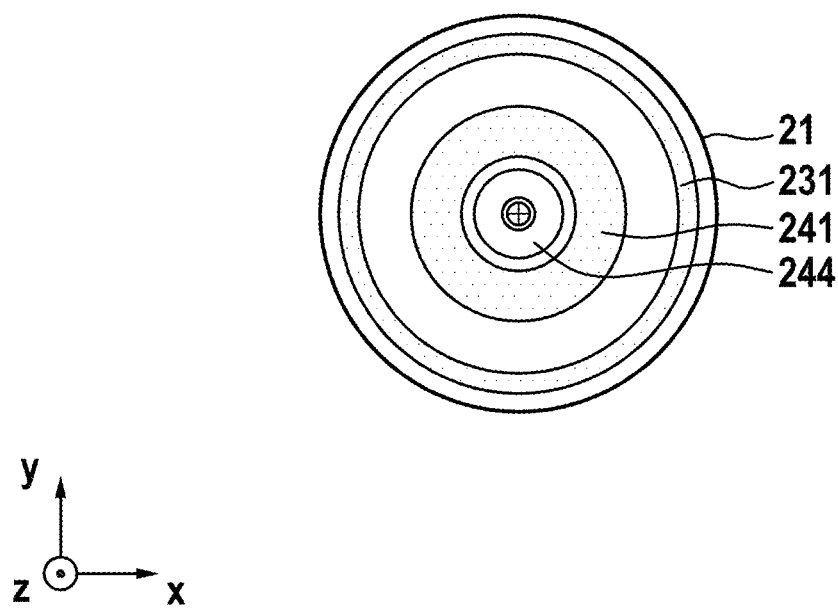

FIG. 3b: As in FIG. 3a, but with concentric arrangement of the two magnet arrays 231 and 241. In order to minimize the magnetic coupling between the magnet arrays 231, 241, their distance is maximized by designing the inner diameter of the magnet array 231 significantly larger than the outer diameter of the magnet array 241.

Figure 3C:
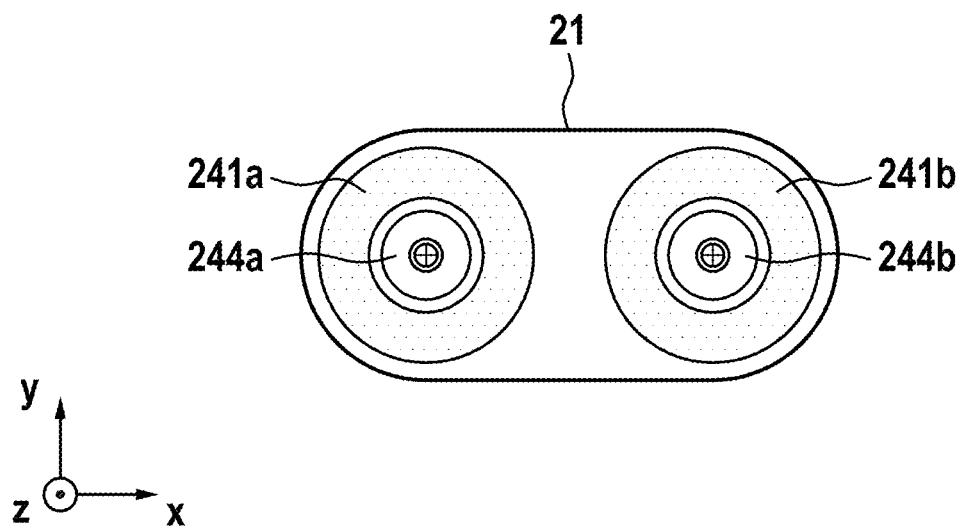

FIG. 3c: A housing 21 having two magnet arrays 241 a and b, each rotatably mounted in rZ. Two degrees of freedom are thus available on the housing 21 for driving a manipulator 22. According to FIG. 1c, none of the magnet arrays 241 are rigidly connected to the housing 12. Nevertheless, the housing 21 is controllable in all six degrees of freedom. In particular, it can be moved in rZ by a rotational movement of the two magnet arrays 241 about a common turning center.

Figure 3D:
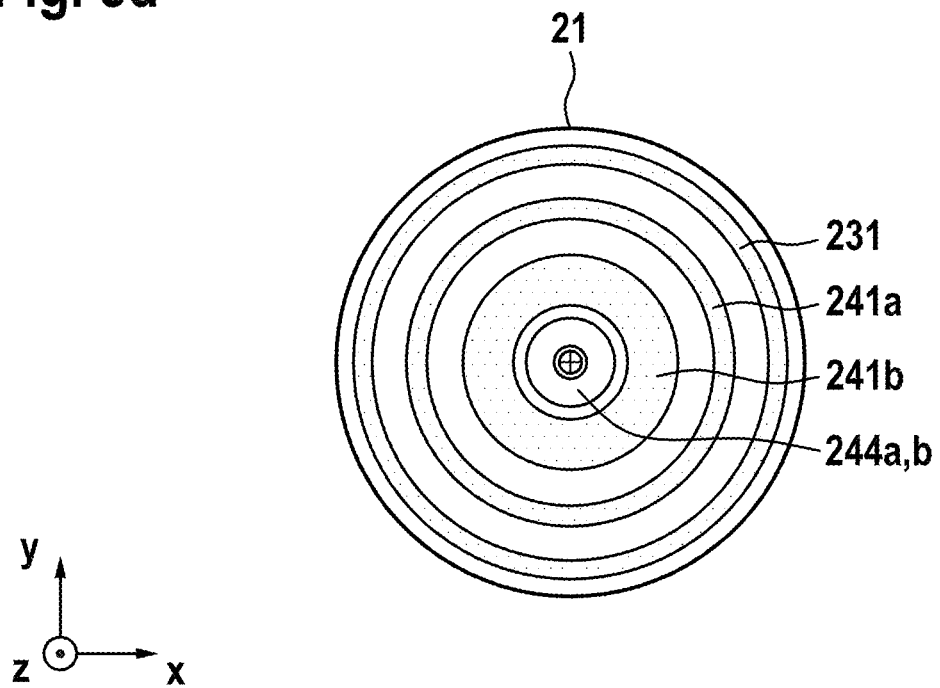

FIG. 3d: As with FIG. 3c, this arrangement has two magnet arrays 241a and b, which are rotatably mounted in rZ, but in a concentric arrangement. Additionally, a fixed magnet array 231 is present. Without the fixed magnet array 231, the housing 21 would not be controllable in rZ: since the rotation axes of 241a and b coincide, no torque Mz can be applied to the housing 21. For example, two concentrically arranged hollow shafts can be employed as outputs for the concentrically mounted magnet arrays 241a and b.

Figure 3E:
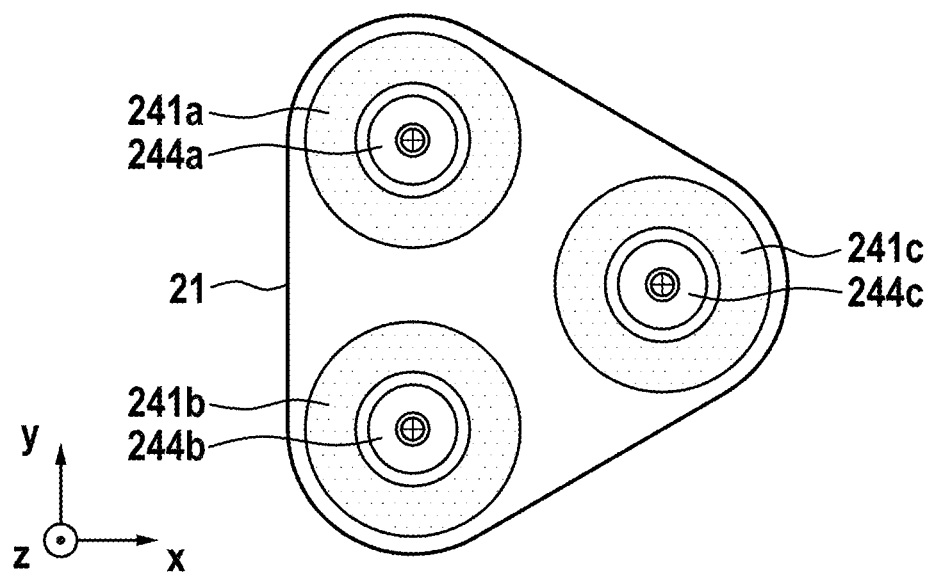

FIG. 3e: Housing 21 for driving a manipulator 22 having three degrees of freedom. The design is similar to FIG. 3c, but with three magnet arrays 241a, b, and c rotatably mounted in rZ.

Figure 4:
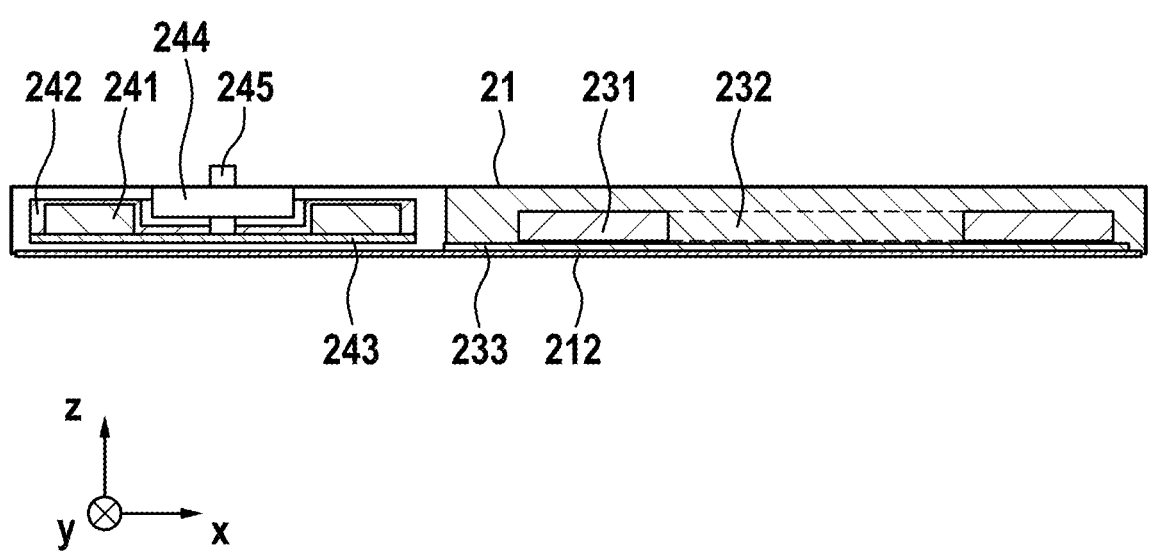
Figure 5A:
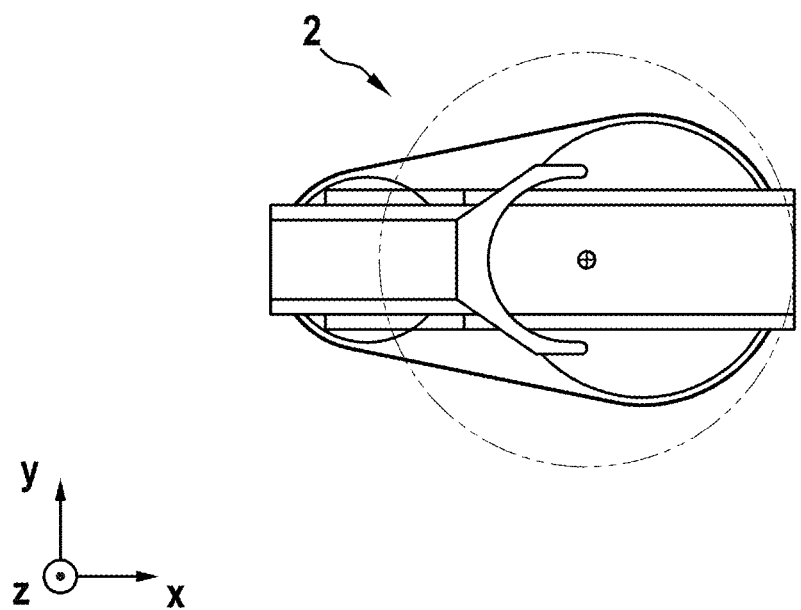
Figure 5B:
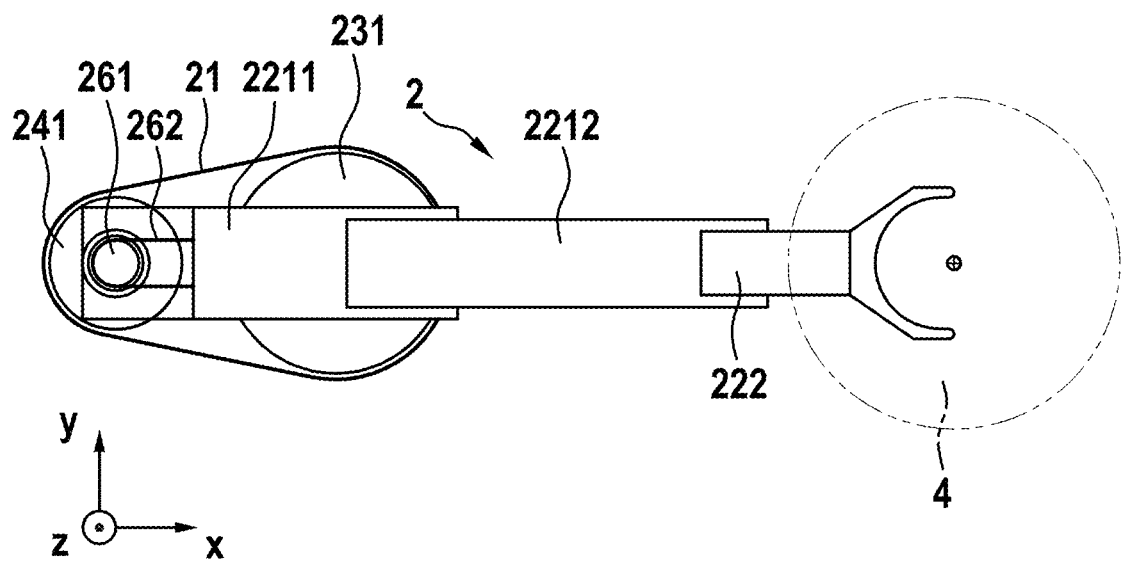
Figure 5C:
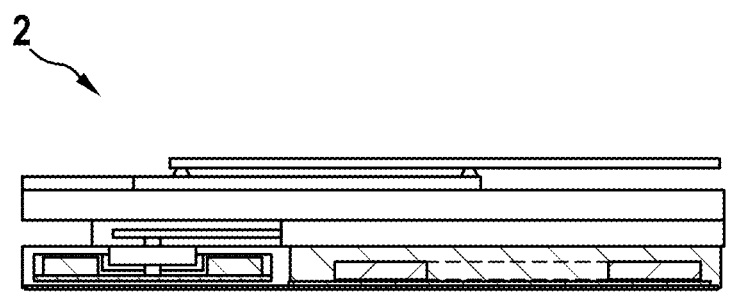
Figure 5C:
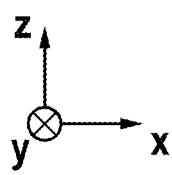
Figure 5D:
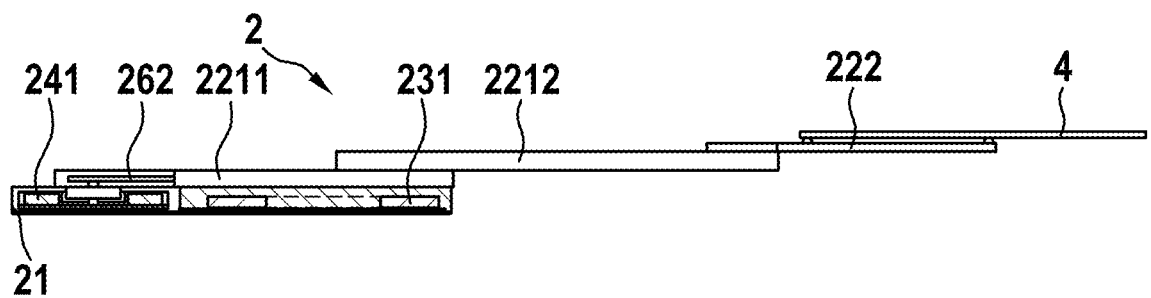
Figure 5D:
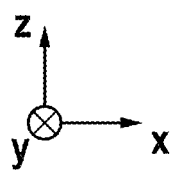
Figure 6A:
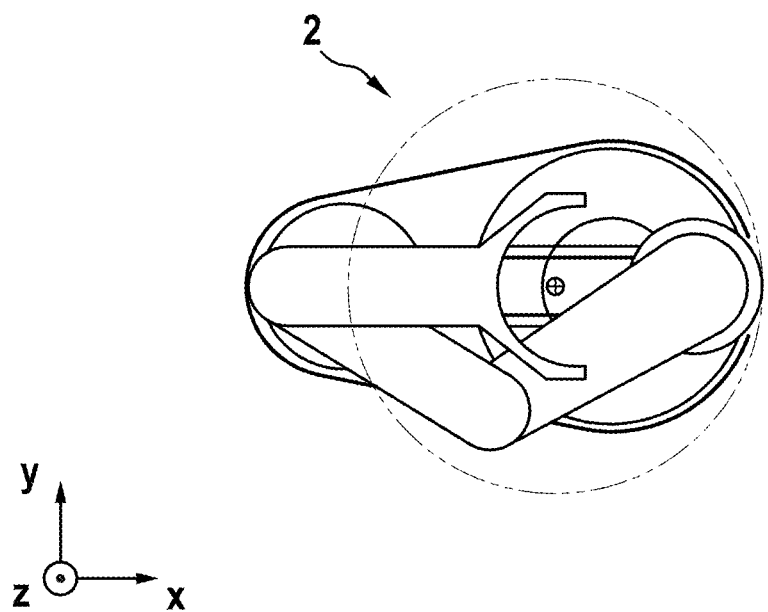
Figure 6B:
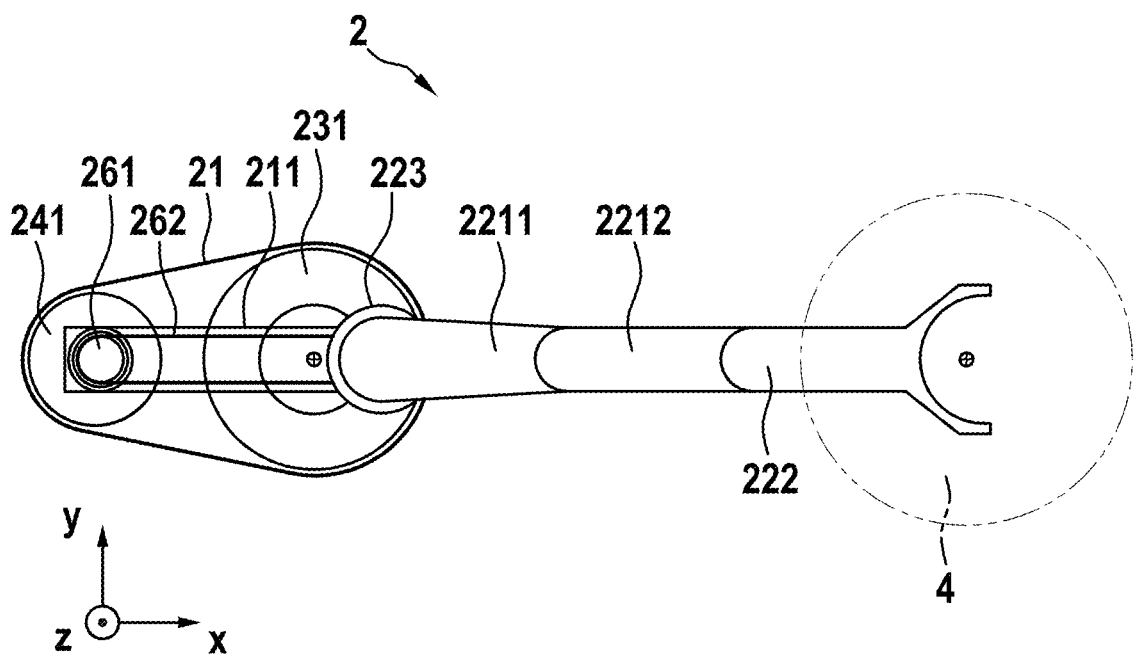
Figure 6C:
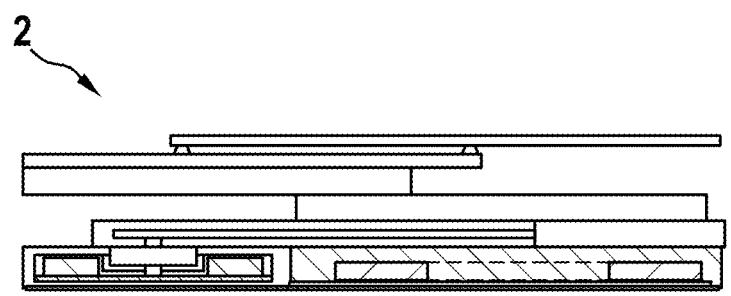
Figure 6C:
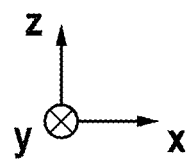
Figure 6D:
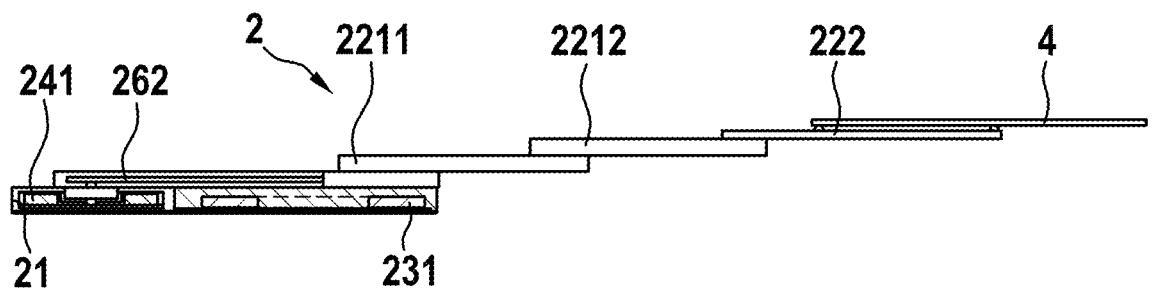
Figure 6D:
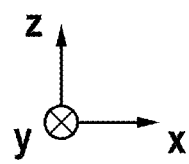

FIG. 4 details the design of the housing 21 of FIG. 3a in a side view. It shows a pivot bearing 244 which guides an output 245 formed as a shaft. This shaft is connected in the housing 21 to a magnet carrier supporting the magnet array 241. The output 245 makes the rotation of the magnet array 241 about the Z-axis available at the housing 21, i.e. it transfers the rotation to the top side of the housing 21.

The shaft can be connected to the manipulator 22 via the coupling 26. The magnet array 231, which is fixedly connected to the housing 21 via the magnet carrier 232, is located next to it. Both magnet arrays 231, 241 have a respective code assembly 233, 243 attached to the bottom. Through a transparent housing base 212, the code assemblies 233, 243 can be read by the camera modules 32 in the stator 3 (see FIG. 7).

FIG. 5 shows the housing 2 of FIG. 4 in conjunction with a two-stage linear manipulator 22 with one degree of freedom. More specifically, in a top view, FIG. 5a shows the contracted state of the linear manipulator 22 and FIG. 5b in a top view shows the extended state of the linear manipulator 22, and in a side view, FIG. 5c shows the contracted state of the linear manipulator 22 and FIG. 5d shows in a side view the extended state of the linear manipulator 22.

The linear manipulator 22 of FIG. 5 has a linear guide as the first stage 2211 and a linear guide mounted thereon as the second stage 2212. On the second stage 2212, an end effector 222 for receiving a payload 4 is attached, in this case shown as a wafer for the semiconductor industry. A belt pulley 261 is mounted on the output 245, formed as a shaft, of the magnet array 241, the pulley driving the two-stage linear manipulator 22 via a transmission belt 262. In the contracted state, the transport body 2 with payload 4 has very compact external dimensions, while the manipulator 22 in the expanded state has a process nest lying well to the side of the stator 3 in a process station PM (see FIG. 9 or 10) to load it with the wafer 4 or to remove a wafer 4.

Given that the manipulator 22 is freely positionable in its degree of freedom, the end effector 222 can also reach process nests at intermediate positions between the two end positions of the end effector 222. For applications with the highest cleanliness requirements, such as handling wafers 4 in vacuo, linear guides or rolling bearings made at least partially of ceramic or solid-state joints are preferably used.

FIG. 6 shows the transport body 2 of FIG. 4 in conjunction with an articulated arm manipulator 22 having one degree of freedom. More specifically, FIG. 6a, in a top view, shows the contracted state of the articulated arm manipulator 22, and FIG. 6b, in a top view, shows the extended state of the articulated arm manipulator 22, and FIG. 6c, in a side view, shows the contracted state of the articulated arm manipulator 22 and FIG. 6d, in a side view, shows the extended state of the articulated arm manipulator 22.

Like the manipulator 22 in FIG. 5, the articulated arm manipulator 22 of FIG. 6 guides the payload 4 on a linear path and assumes compact outer dimensions in the contracted state. This manipulator 22 is also freely positionable and can reach process nests at different distances from the transport body 2. Again, ceramic bearings or solid-state joints are preferably used when maximum cleanliness requirements are to be met. The kinematic means 221 is connected to the housing 21 via a mounting flange 223.

Figure 7:
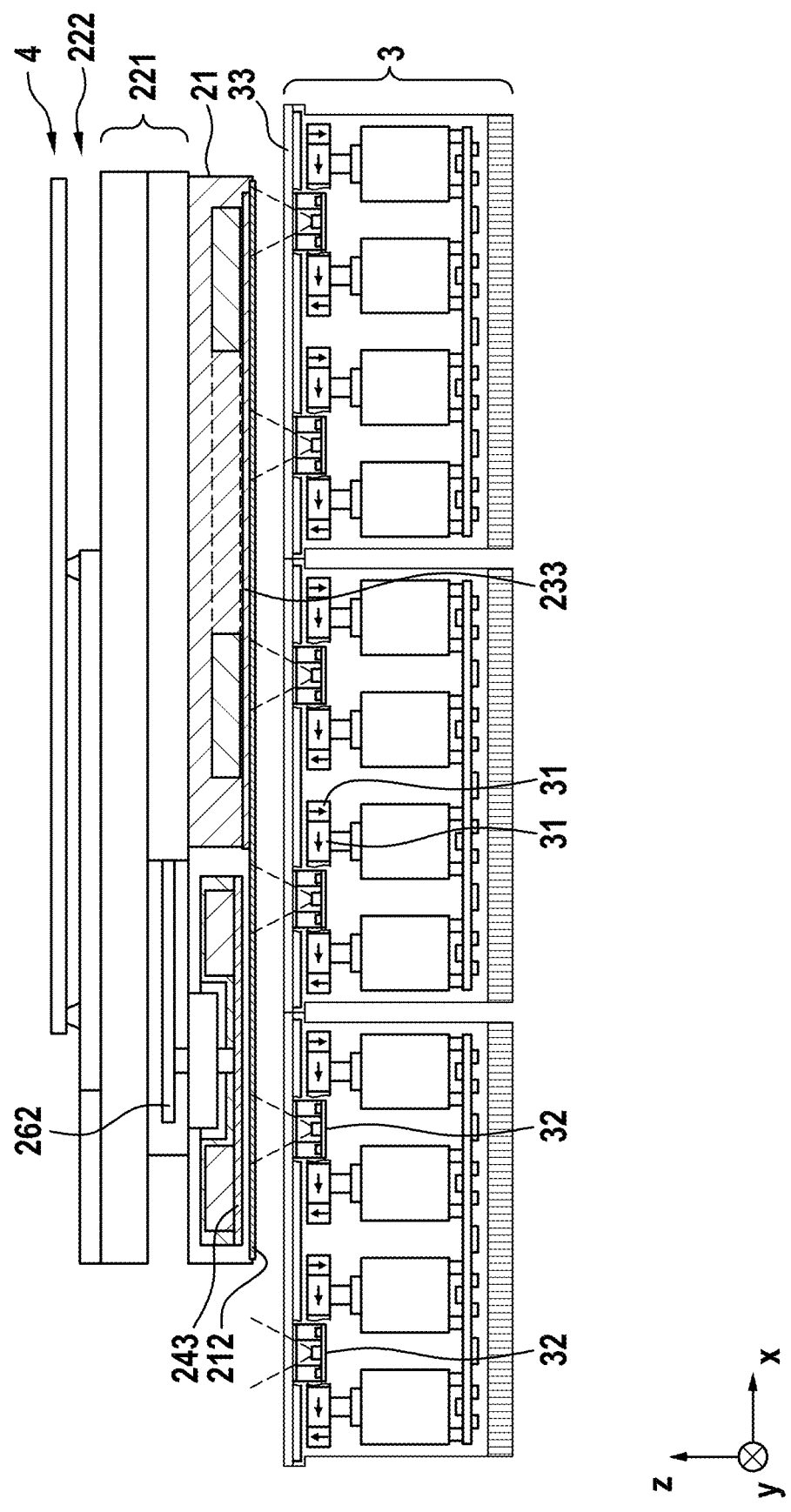

In FIG. 7, an exemplary embodiment of the conveying device according to the disclosure with the transport body 2 of FIG. 5 is shown on the stator 3. The stator 3 is in this case formed from three identical stator modules. In the cross-sectional image, the regular arrangement of the control magnets 31 and actuators in the stator 3 can be seen, as well as the regular arrangement of the camera modules 32 that read the code assemblies 233, 243 attached to the magnet arrays 231, 241. The code assemblies 233, 243 not only contain the position information but also an identification code by which they can be uniquely assigned to a magnet array 231, 241 in a specific transport body 2. Depending on the constellation, a code array 233, 243 is simultaneously detected by a plurality of camera modules 32 such that each magnet array 231, 241 is located multiple times. This redundancy can be utilized to increase the accuracy of position detection by averaging the code assemblies 233, 243. The camera modules 32 provide the position and identification data of the detected code assemblies 233, 243 to the system controller which determines from this data the actual position of the transport body 2 and the manipulator 22.

The motion control of the transport body 2 according to the disclosure with manipulator 22 places increased demands on the control of the control magnets 31 in the stator 3 with regard to the number of degrees of freedom. Whereas a transport body 2 known from the prior art typically has six degrees of freedom of movement, the proposed mechanical transport body 2 with manipulator 22 has more than six degrees of freedom. The number is derived from the sum of the degrees of freedom of the housing 21 and the manipulator 22. For example, if the manipulator 22 has one degree of freedom, the transport body 2 has a total of 7 (=6+1) degrees of freedom.

Figure 8:
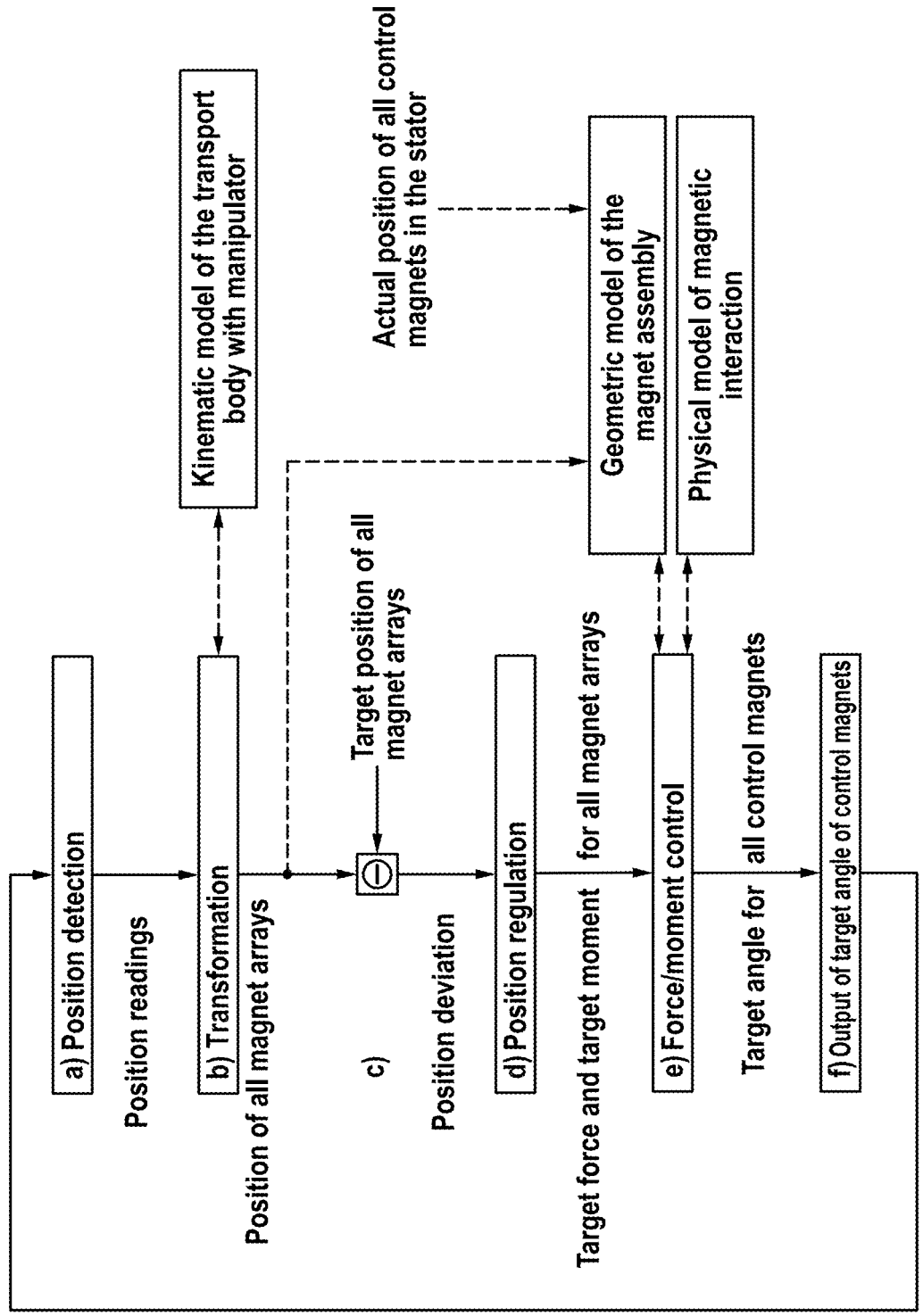

FIG. 8 shows a method of controlling the path of motion a transport body 2 with manipulator 22. The method is implemented as an algorithm in the system controller. The following steps a)-e) are performed cyclically in a program loop with a fixed frequency in the range of about 100 Hz-10,000 Hz:

a) The position of the transport body 2 is detected in all degrees of freedom by means of distributed position sensors, in particular using camera modules 32, in the stator 3 or in the transport body 2. These modules observe code assemblies 233, 243 on a magnet array 231, 241 or on other moving portions and derive the relative position between the position sensor and the code assembly 233, 243 therefrom. All position information is transmitted to the system controller.

b) A kinematic model of the conveying device is stored in the system controller, the model describing the geometry of the components as well as the locations of the joints, bearings, position sensors, and the code assemblies 233, 243. By means of a geometrical transformation, the actual position of all magnet arrays 231, 241 in the stator coordinate system is calculated from the model and the data of the position sensors.

c) The position deviation of the magnet arrays 231, 241 is calculated as the difference of the actual position of the magnet arrays 231, 241 from a pre-defined target position in all degrees of freedom. In order to dynamically guide the transport body 2 with manipulator 22 along a target trajectory, the target position in each loop pass is incrementally changed according to the target trajectory.

d) A position controller translates the position deviations into a vectorial target force and a vectorial target moment for each magnet array 231, 241. This is achieved using, e.g., a PID algorithm applied to each of the degrees of freedom involved.

e) The force/moment control determines the target position of the control magnets 31 in the stator 3 from the vectorial target force and the target moment of all magnet arrays 231, 241 and from the actual position of all magnet arrays 231, 241, and from the actual position of all control magnets 31 in the stator 3, and from a geometric model of all magnet arrays 231, 241 and a physical model of the magnetic interaction. The target position is optimized so that when setting the target position of all the control magnets 31 in the model, the predicted vectorial forces and moments acting on all the magnet arrays 231, 241 match the target forces and target moments as closely as possible. For this purpose, a dimension is calculated using an error function, the dimension expressing, as a numerical value, the deviation of the modeled forces and moments from the target forces and moments. This error function extends to all of the magnet arrays 231, 241 involved and all of their degrees of freedom. For example, an optimization algorithm or neural network is used to minimize the error function.

f) Output of the target angle to the actuators of the control magnets 31.

Figure 9:
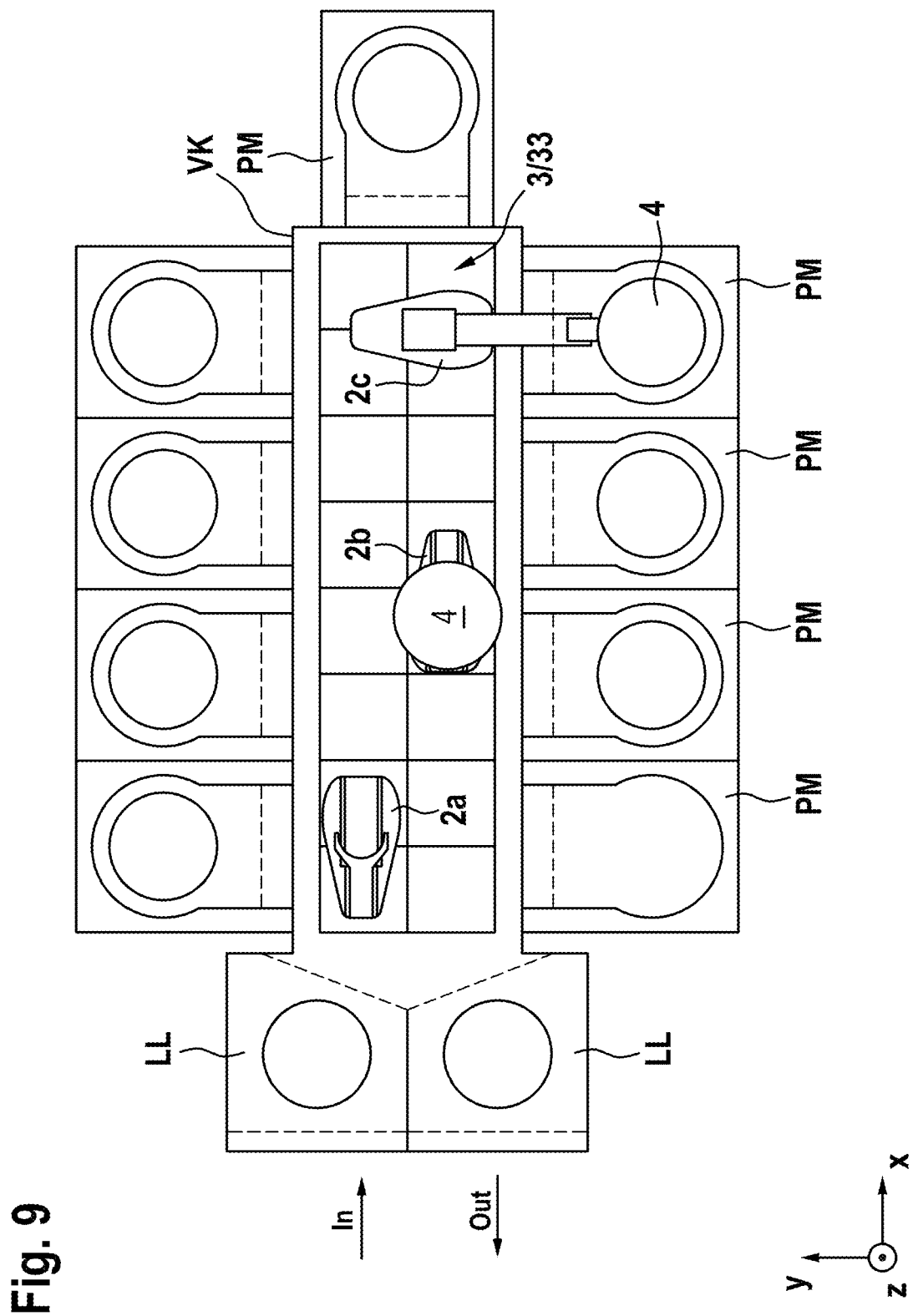
Figure 10A:
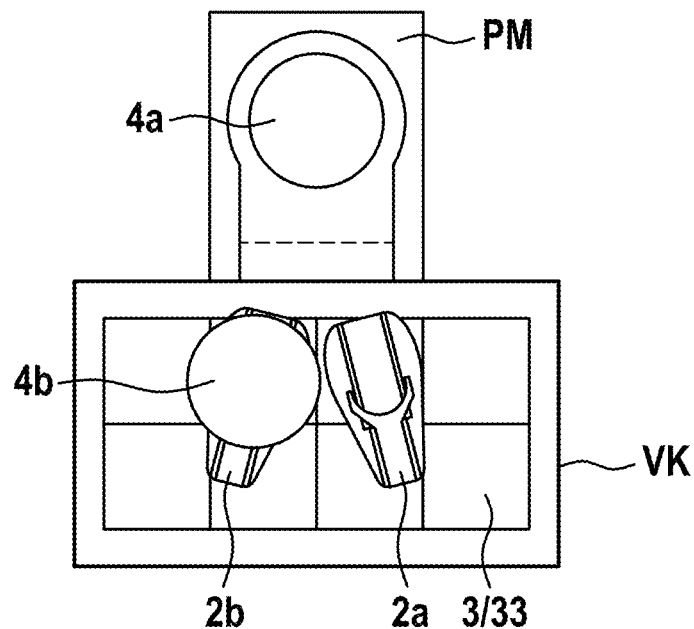
Figure 10B:
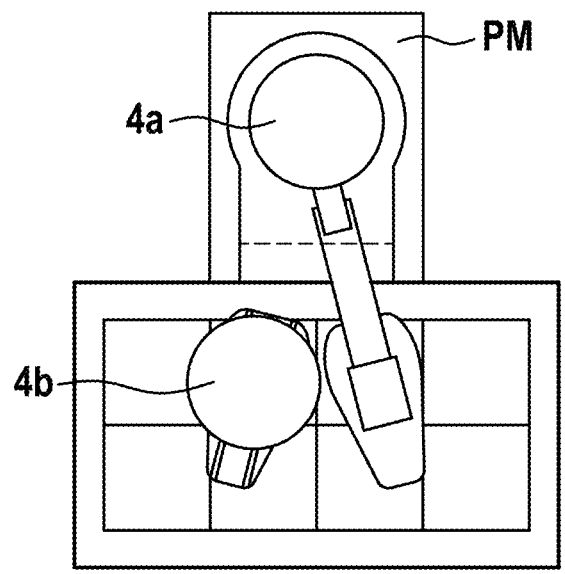
Figure 10C:
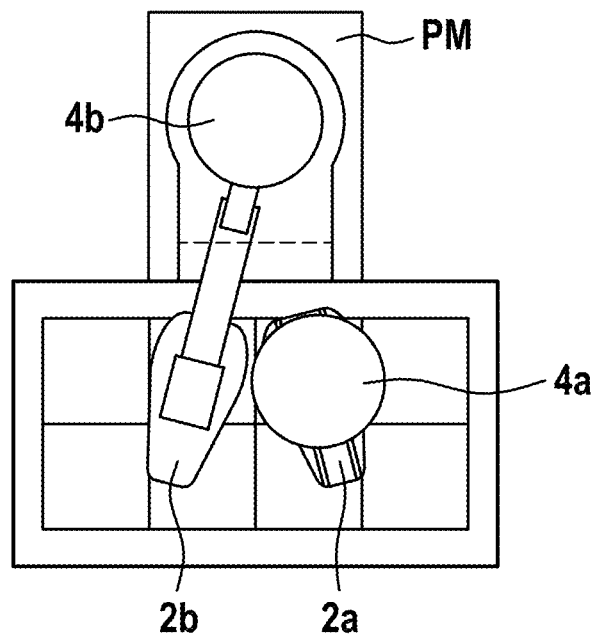
Figure 10D:
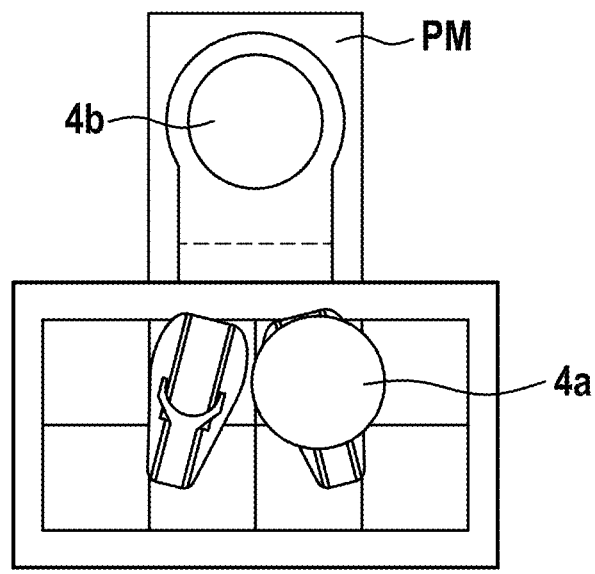

FIG. 9 schematically illustrates a production facility for the semiconductor industry. A vacuum transport chamber VK is equipped with a glass bottom, whereby the modules of the stator 3 are mounted outside the vacuum area under the transport chamber VK so that the levitation field penetrates into the transport chamber VK through the glass bottom. In the transport chamber VK, three transport bodies 2a, 2b and 2c float in the levitation field: the transport bodies 2a and 2b are in the contracted state, while transport body 2c is in the expanded state for loading a circular arc-shaped process nest of a process station PM. By operating several transport bodies 2 at different process stations PM simultaneously, a high wafer throughput rate is achieved. In addition, wafers 4 can be conveyed through the process stations PM in individual order, so that different process sequences can be done in a production facility in a variant-rich production scenario.

FIG. 10 shows, in four temporal steps 1 to 4, a method for quickly changing a wafer 4 in a circular arc-shaped process nest of a process station PM, so that the process pause between two successive process sequences in the process station PM becomes minimal. For this purpose, two transport bodies 2a and 2b are located next to each other in front of the PM process station. Between step 2 and step 3, transport body 2a removes the processed wafer 4a from the process station PM and conveys it by contracting its manipulator 22 over its housing 21. During the contraction movement of transport body 2a, transport body 2b performs an expansion movement to introduce the next wafer 4b to be processed into the process station PM.

The contours of the wafers 4 can in this case overlap in the X/Y plane at times. To avoid collisions, the end effectors 222 of the two transport bodies 2a, 2b are guided at different heights or at different slopes.

Figure 11A:
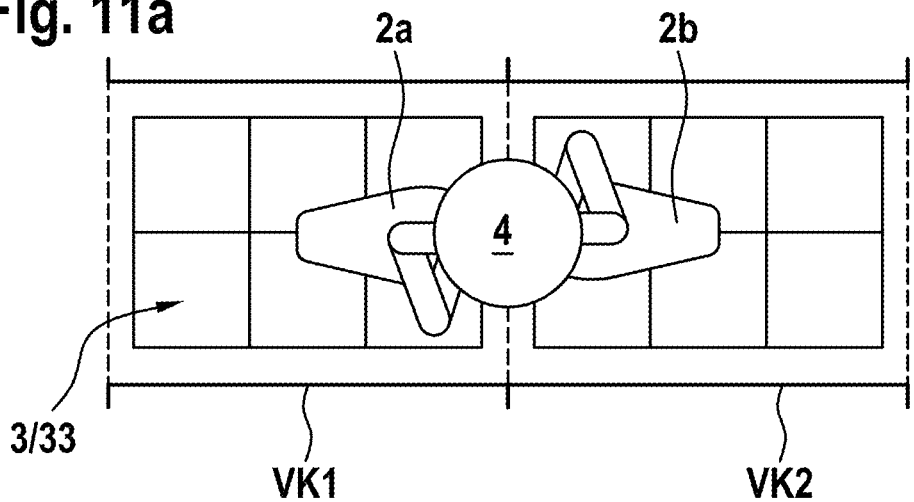

FIG. 11a shows a method for transferring a wafer 4, without intermediate storage, from one transport body 2a to another transport body 2b.

Figure 11B:
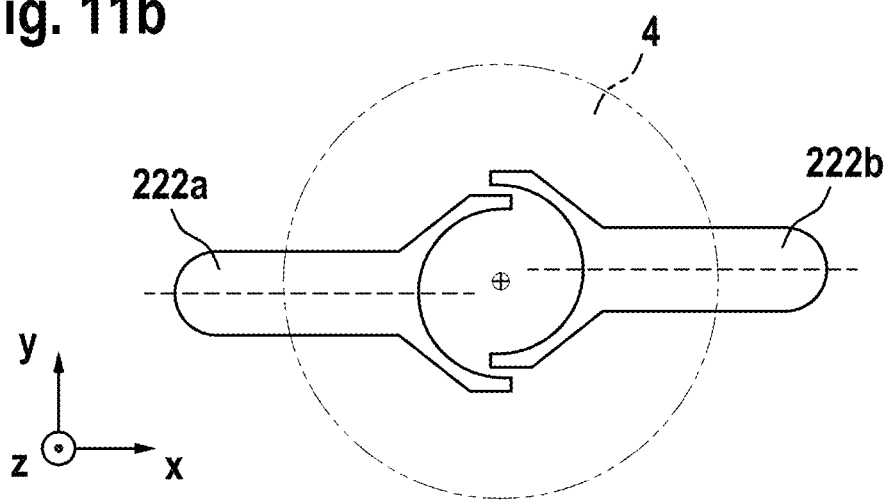

In the illustration of FIG. 11b, according to a first variant of the method of FIG. 11a, the wafer 4 is transported using a symmetrically-designed end effector 222a, in which case the wafer center is laterally adjacent to the line of symmetry of the end effector 222a. A second, identical end effector 222b, is rotated by 180°, approaches from the opposite side and is guided underneath the wafers 4. The pairs of fingers of the both of the end effectors 222a, 222b are laterally offset so that they do not collide. The wafer center is laterally offset relative to the line of symmetry of the end effector 222b. Transfer is accomplished by an upward movement of end effector 222b and a downward movement of end effector 222a.

Figure 11C:
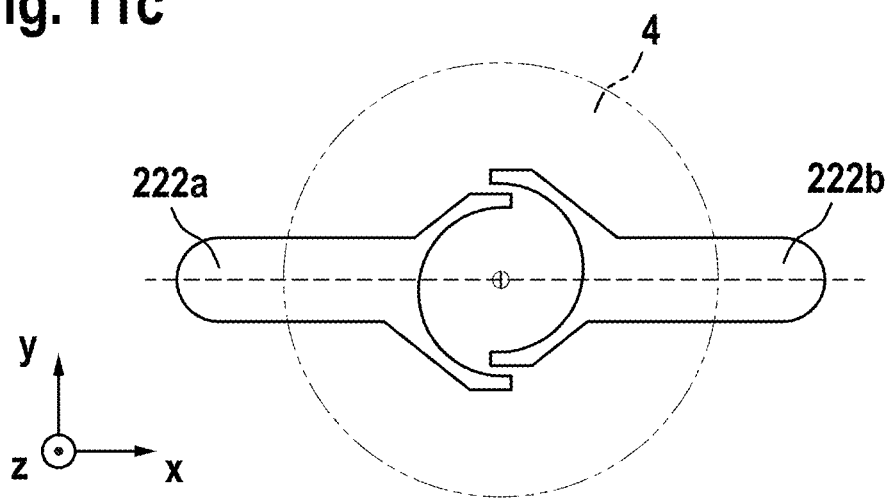

In the illustration of FIG. 11c, according to a second variant of the method of FIG. 11a, the respective fingers are attached slightly asymmetrically on the end effectors 222a, 222b, such that two end effectors 222a, 222b, which are offset 180° from one another, can move together collision-free along an imaginary centerline.

Figure 12A:
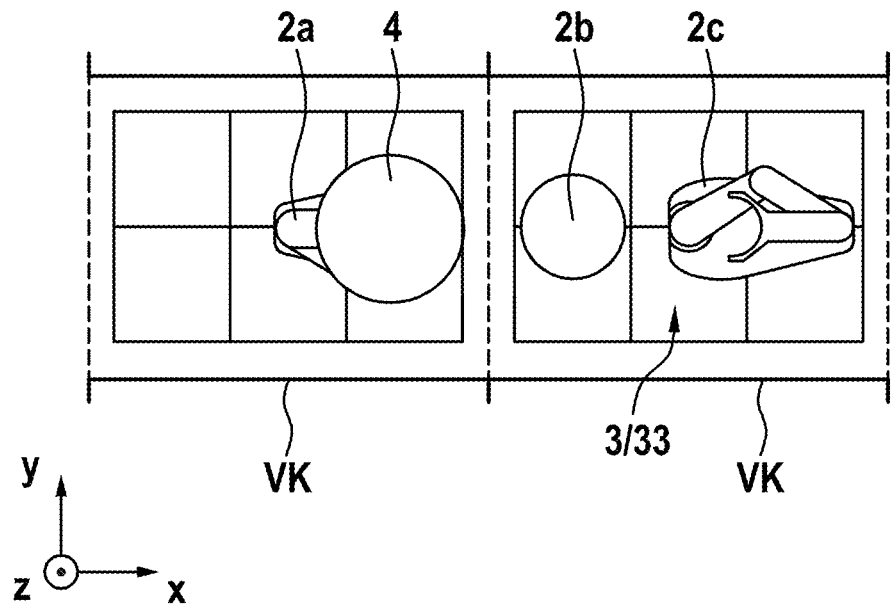
Figure 12B:
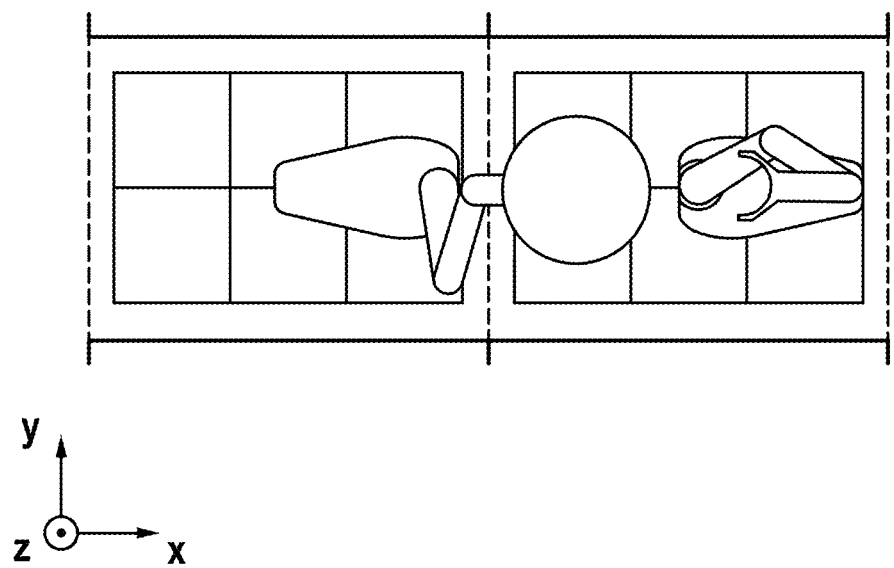

FIG. 12 shows a method for transferring the wafer 4, the angular position of which can be changed in the full range of 360°. To this end, a first transport body 2a with manipulator 22 is transferred to a second transport body 2b, which is designed as a circular disc, or whose housing has a circular surface on its upper side. The second transport body 2b receives the wafer 4 centrally (step 2). The second transport body 2b serves as an intermediate storage for the wafer 4. The wafer 4 is in this case rotated about the Z-axis by a predefined angle (step 3). A third transport body 2c with manipulator 22 then accepts the wafer 4 in a new orientation (step 4).

Another variant for aligning the rotational position of a wafer 4 using only one transport body 2 is described below. Two manipulators 22 are installed on one transport body 2. A first manipulator 22 has two degrees of freedom, one for contraction/expansion of the end effector 222 in the radial direction (as previously described) and another for lifting the end effector 222 in the Z direction. A second manipulator 22 takes over the orientation of the rotational position of the wafer 4. It has one degree of freedom, the rotation about the Z-axis perpendicular to the transport plane, and an end effector 222 for centrally accepting the wafer 4. Thus, a wafer 4 lying on the end-effector 222 can be rotated about its center point. With only one transport body 2, this arrangement enables a wafer 4 to be removed from a process nest and transported, the rotational position to be aligned during transport, and the wafer 4 to be dropped off at the target location in the intended rotational position. The following movement sequence is provided for this purpose:

a) Removal of the wafer 4 from the process nest: At the staging location, the first manipulator 22 moves its end effector 222 under the wafer 4 lying in the process nest. After a vertical movement, the wafer 4 rests on the end effector 222.

b) Contraction movement of the first manipulator 22. The wafer 4 is subsequently located above the transport body 2, and the second manipulator 22 is then located centrally below the wafer 4 c) Transfer of the wafer 4 from the first manipulator 22 to the second manipulator 22 by a downward movement of the first manipulator 22.

d) Orientation of the rotational position of the wafer 4 by rotation of the second manipulator 22. For alignment with respect to a notch in the edge of the wafer 4 (notch), a sensor can be provided that monitors the position of the notch during rotation.

e) Transfer of the wafer 4 from the second manipulator 22 to the first manipulator 22, by a vertical movement of the first manipulator 22. The wafer 4 is then in the intended rotational position on the first manipulator 22.

f) Dropping off the wafer 4 at the target location using the first manipulator 22.

A conveying device designed for conveying one or more payloads 4, in particular wafers, by means of transport bodies 2 is disclosed. The transport bodies 2 can be floatingly moved and positioned over a transport surface 33 of a stator 3. Preferably, the moving and positioning is performed with respect to all six degrees of freedom. The transport body 2 has a movable boom or a movable manipulator 22 or a movable robotic arm. At the end effector thereof 222, the payload 4 can be deposited or fastened. In developments, the payload 4 can also be processed and/or checked. The processing and/or checking can also be carried out by an end effector 222 of an additional transport body 2 of the same conveying device.

LIST OF REFERENCE CHARACTERS

2 Transport body
21 Housing
212 Housing base
22 Manipulator
221 Kinematic means
2211 First stage
2212 Second stage
222 End effector
223 Mounting flange
23 Drive unit (for housing)
231 Magnet array fixed to the housing
232 Magnet carrier
233 Code assembly (for housing)
24 Drive unit (for manipulator)
241 Magnet array (movable relative to housing)

243 Code assembly (for manipulator)
244 Bearing (for magnet array relative to housing)
245 Output
25 Electronics unit
251 Energy storage
252 Communication interface
253 User interface
26 Coupling
261 Belt pulley
262 Transmission belt
3 Stator
31 Control magnet
32 Camera module
33 Transport surface
4 Payload/wafer
LL Load Lock
PM Process Station
VF Transport Chamber

The invention claimed is:

1. A conveying device for conveying at least one payload, comprising:
a stator defining a transport surface;
at least one transport body configured to be floatingly moved and positioned over the transport surface of the stator, the at least one transport body including an end effector and a housing, the at least one payload associated with the at least one transport body; and
one of a boom, a manipulator, or a robotic arm extending between the end effector and the housing of the at least one transport body,
wherein:
the end effector is configured to be brought into operative connection with the at least one payload,
the boom, the manipulator, or the robotic arm enables and controls at least one first degree of freedom of movement of the end effector relative to the housing, and
at least one magnet array is movably accommodated in the housing of the at least one transport body, the at least one magnet array mechanically coupled to the boom, the manipulator, or robotic arm,
the at least one magnet array is configured to be moved by being brought into magnetic interaction with the stator,
the at least one magnet array is rotatably mounted in a bearing,
a belt pulley is attached or coupled in a fixed manner to the at least one magnet array, and
the belt pulley is mechanically coupled to the boom, the manipulator, or the robotic arm via a transmission belt.

2. A conveying device for conveying at least one payload, comprising:
a stator defining a transport surface;
at least one transport body configured to be floatingly moved and positioned over the transport surface of the stator, the at least one transport body including an end effector and a housing, the at least one payload associated with the at least one transport body; and
one of a boom, a manipulator, or a robotic arm extending between the end effector and the housing of the at least one transport body,
wherein:
the end effector is configured to be brought into operative connection with the at least one payload,
the boom, the manipulator, or the robotic arm enables and controls at least one first degree of freedom of movement of the end effector relative to the housing, and
at least one magnet array is movably accommodated in the housing of the at least one transport body, the at least one magnet array mechanically coupled to the boom, the manipulator, or robotic arm,
the at least one magnet array is configured to be moved by being brought into magnetic interaction with the stator, and
the at least one transport body includes two transport bodies each having symmetric end effectors configured to be moved toward one another at a lateral offset.

3. A conveying device for conveying at least one payload, comprising:
a stator defining a transport surface;
at least one transport body configured to be floatingly moved and positioned over the transport surface of the stator, the at least one transport body including an end effector and a housing, the at least one payload associated with the at least one transport body; and
one of a boom, a manipulator, or a robotic arm extending between the end effector and the housing of the at least one transport body,
wherein:
the end effector is configured to be brought into operative connection with the at least one payload,
the boom, the manipulator, or the robotic arm enables and controls at least one first degree of freedom of movement of the end effector relative to the housing, and
at least one magnet array is movably accommodated in the housing of the at least one transport body, the at least one magnet array mechanically coupled to the boom, the manipulator, or robotic arm,
the at least one magnet array is configured to be moved by being brought into magnetic interaction with the stator, and
the at least one transport body includes two transport bodies each having end effectors including two asymmetric fingers.

4. The conveying device according to claim 1, wherein the first degree of freedom of movement is a variable distance between the end effector and the housing along or parallel to the transport surface.

5. The conveying device according to claim 1, wherein the operative connection is a carrying, a handling, a positioning, a fixing, a processing, and/or a checking performable by the end effector on the at least one payload.

6. The conveying device according to claim 1, wherein the boom, the manipulator, or the robotic arm comprises a kinematic structure having at least two stages or sections.

7. The conveying device according to claim 6, wherein the at least two stages or sections of the kinematic structure are linearly shiftable or pivotable relative to one another.

8. The conveying device according to claim 1, further comprising:
a plurality of process stations, each process station arranged laterally adjacent to the transport surface for processing the at least one payload.

9. The conveying device according to claim 8, wherein:
each process station includes a process nest arranged having a lateral distance to the transport surface, and
the lateral distance is bridgeable using the boom, the manipulator, or the robotic arm in a corresponding extracted state.

10. The conveying device according to claim 1, wherein, in a corresponding contracted state of the boom, the manipulator, or the robotic arm, a center point of the at least one payload, or a portion of the at least one payload, or the at least one payload in its entirety, is arranged above the housing of the at least one transport body.

11. The conveying device according to claim 1, wherein the at least one magnet array is accommodated and attached in the housing of the at least one transport body.

12. The conveying device according to claim 1, further comprising:
an additional transport body having a housing which is or has a rotatable disc.

13. The conveying device according to claim 1, wherein:
a transport chamber is formed over the transport surface,
a gas or a gas mixture or a liquid, or a vacuum, or an ultra-high vacuum, or an aseptic area, or an ABC protected area is provided in the transport chamber, and
the at least one transport body is accommodated in the transport chamber.

14. The conveying device according to claim 2, wherein the first degree of freedom of movement is a variable distance between the end effector and the housing along or parallel to the transport surface.

15. The conveying device according to claim 2, wherein the at least one magnet array is accommodated and attached in the housing of the at least one transport body.

16. The conveying device according to claim 2, wherein:
the at least one magnet array is rotatably mounted in a bearing,
a belt pulley is attached or coupled in a fixed manner to the at least one magnet array, and
the belt pulley is mechanically coupled to the boom, the manipulator, or the robotic arm via a transmission belt.

17. The conveying device according to claim 2, wherein:
the boom, the manipulator, or the robotic arm comprises a kinematic structure having at least two stages or sections, and
the at least two stages or sections of the kinematic structure are linearly shiftable or pivotable relative to one another.

18. The conveying device according to claim 3, wherein the first degree of freedom of movement is a variable distance between the end effector and the housing along or parallel to the transport surface.

19. The conveying device according to claim 3, wherein the at least one magnet array is accommodated and attached in the housing of the at least one transport body.

20. The conveying device according to claim 3, wherein:
the at least one magnet array is rotatably mounted in a bearing,
a belt pulley is attached or coupled in a fixed manner to the at least one magnet array, and
the belt pulley is mechanically coupled to the boom, the manipulator, or the robotic arm via a transmission belt.

\* \* \* \* \*